(12) United States Patent
Kallfelz et al.

(10) Patent No.: US 9,857,430 B2
(45) Date of Patent: Jan. 2, 2018

(54) TESTER FOR EQUIPMENT, APPARATUS OR COMPONENT WITH DISTRIBUTED PROCESSING FUNCTION

(71) Applicants: Andrew F. Kallfelz, Jamestown, RI (US); Gary T. Rumsey, Exeter, RI (US)

(72) Inventors: Andrew F. Kallfelz, Jamestown, RI (US); Gary T. Rumsey, Exeter, RI (US)

(73) Assignee: Battery Technology Holdings, LLC, Newport, RI (US)

( * ) Notice: Subject to any disclaimer, the term of this patent is extended or adjusted under 35 U.S.C. 154(b) by 719 days.

(21) Appl. No.: 14/120,760

(22) Filed: Jun. 25, 2014

(65) Prior Publication Data

US 2014/0374475 A1 Dec. 25, 2014

Related U.S. Application Data

(63) Continuation-in-part of application No. 13/573,893, filed on Oct. 15, 2012, now Pat. No. 9,619,612.

(51) Int. Cl.
*G01R 31/36* (2006.01)
*H01M 10/42* (2006.01)
*H04Q 9/00* (2006.01)
*G01R 31/00* (2006.01)

(52) U.S. Cl.
CPC ..... *G01R 31/3651* (2013.01); *G01R 31/3627* (2013.01); *G01R 31/3689* (2013.01); *H01M 10/4285* (2013.01); *H04Q 9/00* (2013.01); *G01R 31/007* (2013.01)

(58) Field of Classification Search
CPC combination set(s) only.
See application file for complete search history.

(56) References Cited

U.S. PATENT DOCUMENTS

| 3,873,911 A | 3/1975 | Champlin |
| 4,361,809 A | 11/1982 | Bil |
| 5,699,346 A | 12/1997 | VanDervort |
| 5,744,962 A | 4/1998 | Alber |
| 6,041,287 A * | 3/2000 | Dister ................... B60L 3/0023 702/182 |
| 6,051,976 A | 4/2000 | Bertness |
| 6,064,721 A | 5/2000 | Mohammadian et al. |

(Continued)

OTHER PUBLICATIONS

Written Opinion of the International Searching Authority in connection with PCT/US2013/064501, dated Feb. 19, 2014.*

*Primary Examiner* — Huan Tran
(74) *Attorney, Agent, or Firm* — Michael de Angeli

(57) ABSTRACT

A system and method for testing equipment, apparatuses, or components with distributed measurement and analytical functions. The system comprises a simplified test circuit for obtaining key data representative of the operational characteristics of said equipment, apparatus, or component and transmitting these to a sophisticated device capable of other uses, such as a smart phone or tablet computer. The latter analyzes the raw data with reference to values for nominal characteristics or operation of the equipment, apparatus, or component and provides a result indicative of the condition thereof, or may transmit the data over the Internet to a remote computer for performing the analysis.

52 Claims, 10 Drawing Sheets

(56) References Cited

U.S. PATENT DOCUMENTS

| | | |
|---|---|---|
| 6,081,098 A | 6/2000 | Bertness |
| 6,091,245 A | 7/2000 | Bertness |
| 6,313,608 B1 | 11/2001 | Bertness |
| 6,316,914 B1 * | 11/2001 | Bertness ............ G01R 31/3627 320/134 |
| 6,331,762 B1 | 12/2001 | Bertness |
| 6,351,102 B1 | 2/2002 | Troy |
| 6,359,442 B1 | 3/2002 | Henningson et al. |
| 6,385,300 B1 | 5/2002 | Mohammadian et al. |
| 6,445,158 B1 | 9/2002 | Bertness et al. |
| 6,586,941 B2 | 7/2003 | Bertness |
| 6,590,963 B2 | 7/2003 | Mohammadian et al. |
| 6,704,629 B2 | 3/2004 | Huang |
| 6,738,454 B2 | 5/2004 | Mohammadian et al. |
| 6,759,849 B2 | 7/2004 | Bertness |
| 6,791,464 B2 | 9/2004 | Huang |
| 6,871,151 B2 | 3/2005 | Bertness |
| 6,909,287 B2 | 6/2005 | Bertness |
| 6,967,484 B2 | 11/2005 | Bertness |
| 7,003,411 B2 | 2/2006 | Bertness |
| 7,209,813 B2 | 4/2007 | Namaky |
| 7,212,006 B2 | 5/2007 | Huang |
| 7,446,536 B2 | 11/2008 | Bertness |
| 7,728,597 B2 | 6/2010 | Bertness |
| 7,902,828 B2 | 3/2011 | Huang |
| 7,924,015 B2 | 4/2011 | Bertness |
| 7,928,735 B2 | 4/2011 | Huang et al. |
| 9,058,578 B2 * | 6/2015 | Jones ................ G06Q 10/0631 |
| 9,316,694 B2 * | 4/2016 | Campbell .......... G01R 31/3606 |
| 2002/0003423 A1 | 1/2002 | Bertness et al. |
| 2002/0036504 A1 | 3/2002 | Troy et al. |
| 2003/0088375 A1 | 5/2003 | Bertness et al. |
| 2004/0046566 A1 | 3/2004 | Klang |
| 2004/0263176 A1 | 12/2004 | Vonderhaar et al. |
| 2005/0021475 A1 | 1/2005 | Bertness et al. |
| 2005/0052187 A1 | 3/2005 | Bertness |
| 2005/0162172 A1 | 7/2005 | Bertness |
| 2005/0206388 A1 | 9/2005 | Quint |
| 2006/0006876 A1 | 1/2006 | Bertness |
| 2006/0125483 A1 | 6/2006 | Bertness |
| 2006/0282227 A1 | 12/2006 | Bertness |
| 2008/0204030 A1 * | 8/2008 | Brown ................ G06Q 30/02 324/426 |
| 2009/0051365 A1 | 2/2009 | Bertness |
| 2010/0174446 A1 | 7/2010 | Andreasen |
| 2012/0166240 A1 * | 6/2012 | Jones ................ G06Q 10/0631 705/7.12 |
| 2012/0245871 A1 | 9/2012 | Sheng |
| 2012/0330588 A1 * | 12/2012 | DeMar .................... H04Q 9/00 702/63 |
| 2013/0148283 A1 * | 6/2013 | Forutanpour ...... G01R 31/3606 361/679.31 |
| 2014/0129162 A1 * | 5/2014 | Hallman ............ G01R 31/3606 702/63 |

* cited by examiner

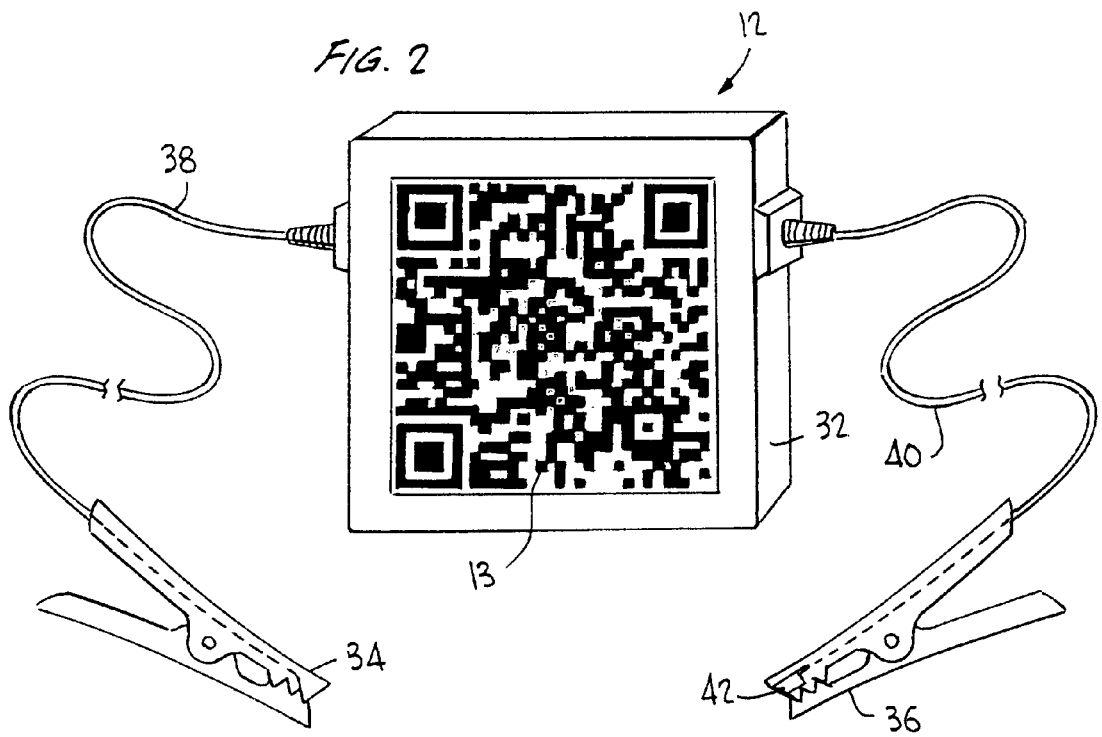
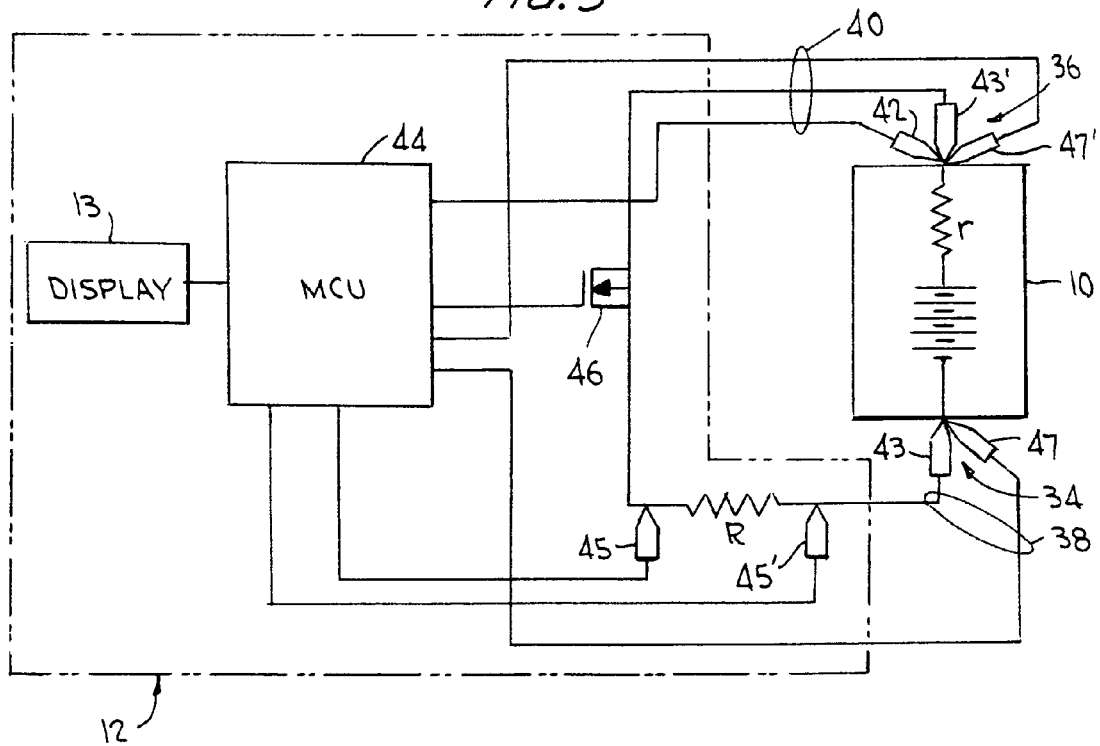

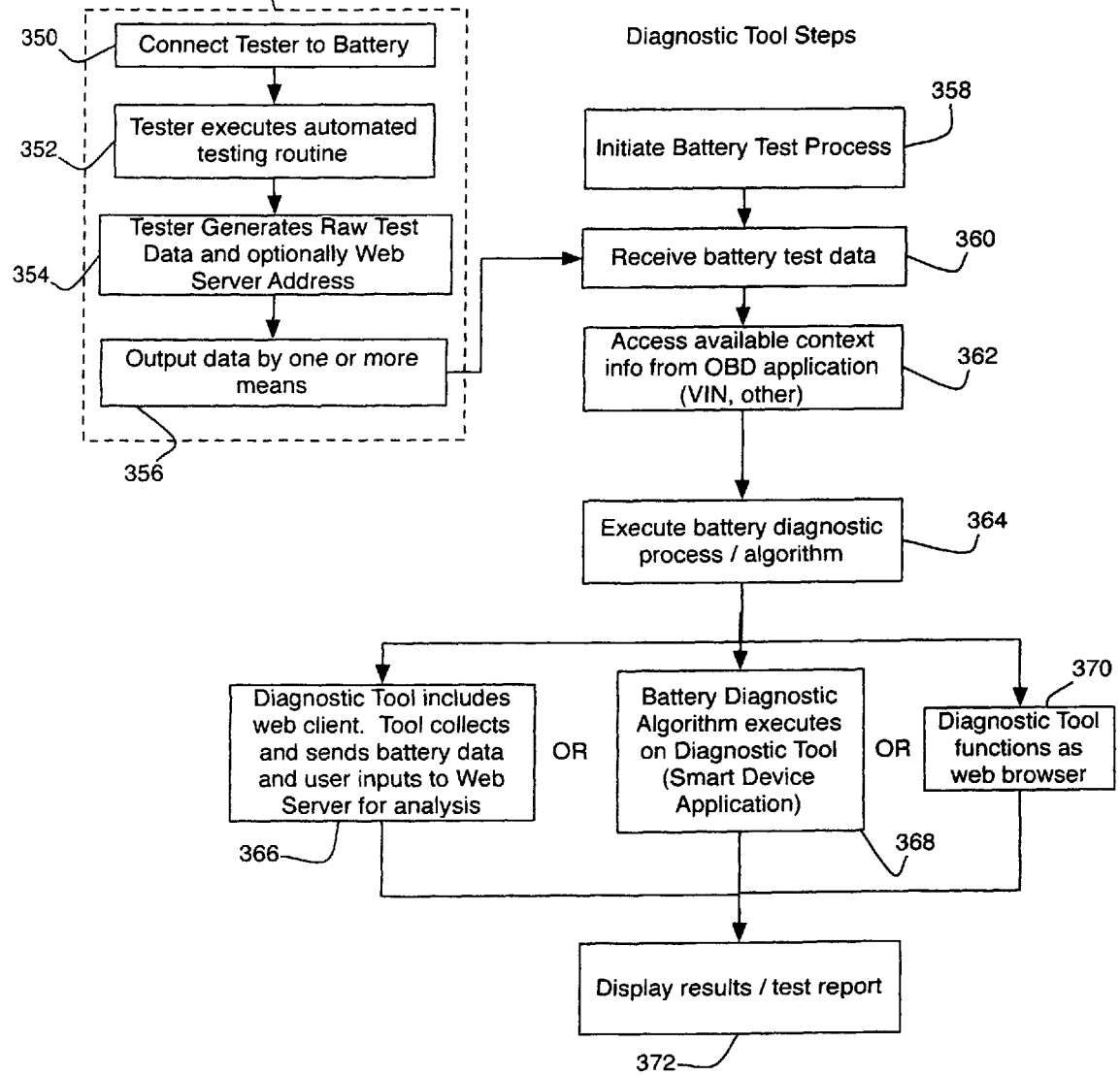

TESTER FOR EQUIPMENT, APPARATUS OR COMPONENT WITH DISTRIBUTED PROCESSING FUNCTION

CROSS-REFERENCE TO RELATED APPLICATION

This application is a continuation-in-part of Ser. No. 14/572,893, filed Oct. 15, 2012.

FIELD OF THE INVENTION

The present invention relates to a tester for various types of equipment, apparatuses, or components, that is, to equipment used to measure useful parameters of a piece of equipment, an apparatus, or a component, and for subsequent analysis of the parameters derived from the test. In particular, this invention relates to a tester for equipment, apparatuses, or components, having distributed functions, wherein a simplified testing device measures fundamental parameters of a piece of equipment, an apparatus, or a component, and transmits this raw data to a separate smart device capable of other uses—such as a smart phone or tablet computer—for analysis, manipulation, and interpretation of the test results to determine the condition of the equipment, apparatus, or component, and optionally for communication of the raw data or condition data to a further destination, for example, from the smart device of an auto dealer's technician to the service manager's computer.

In a further embodiment, the smart device may capture the fundamental parameters from the simplified test device and transmit the fundamental parameters and optionally other information to a web server for analysis, manipulation, and interpretation of the test results to determine the condition of the equipment.

The tester of the invention is described in detail herein with respect to a battery tester, but as noted above is not limited thereto. In this embodiment, a simplified battery testing device is connected to the terminals of a battery for performance of certain tests, and then communicates the raw data resulting therefrom to a smart device for analysis—for example, comparison of measured parameters of the battery to values expected of a battery in good condition—and further appropriate action.

BACKGROUND OF THE INVENTION

Batteries have been commonly used in many applications for years to provide critical electrical energy to a wide range of applications. For example, batteries are widely used in the automotive industry to provide cranking energy to start an engine, to energize accessory loads in a vehicle and to supply electricity to electric motors that provide the motive force for the vehicle. Batteries are also used in many industrial applications to energize indoor vehicle equipment or to provide back-up/standby power to critical equipment such as computers or telecommunications gear in the event of a utility power failure.

Because of the ubiquitous use of batteries in so many applications, it has become important to understand the health of the battery so that the reliability of the primary application is assured. A number of battery testing and monitoring methods have been developed over the past 50 or more years to provide critical information about battery health. The most basic methods include measuring specific gravity of the electrolyte, or measuring voltage and also voltage under a particular load. Measurements of voltage under load are interpreted by the device or by the user of the device to determine the health of the battery.

These methods have been largely replaced over the past 30 years by electronic testing methods that are generally referred to as "ohmic" testing methods, wherein the internal resistance of the battery is measured and compared to a reference value. Exemplary ohmic battery testing methods are described in U.S. Pat. Nos. 6,704,629 and 7,212,006 to Huang, U.S. Pat. No. 5,744,962 to Alber, U.S. Pat. No. 3,873,911 to Champlin, and many others.

Generally, these ohmic test methods are considered to more efficiently and more reliably indicate battery health than traditional load testing methods or specific gravity testing methods. However, ohmic test devices are generally quite costly compared to the equipment required for the more traditional test methods.

Furthermore, ohmic testers as commercially implemented are "integrated", that is, they perform both the measurement and analysis functions. Such integrated battery testers are provided, for example, with test leads to be connected to the battery so that raw data parameters can be measured, and are further provided with a keypad or the like whereby the user can input several items of data to the device concerning the specifications of a battery under test, and with a microprocessor, memory, a stored program, and the like so that the parameters can be properly analyzed and a useful result provided to the user.

The items of data input to a battery tester are referred to herein as "context parameters". Input of these context parameters to the tester is needed in order that the measured parameters of a particular battery under test can be meaningfully compared to nominal specifications of a similar battery in good condition. The context parameters are used to select an appropriate algorithm to calculate battery health and condition with reasonable accuracy. Without such context parameters, the measured values derived from a battery are insufficient to determine battery health or condition.

For example, ohmic testers typically perform the step of measuring the battery's "open-circuit voltage" ("OCV"), that is, the voltage across the battery when disconnected from external loads. Suppose an OCV of 6.4 V is measured. Absent knowledge of the battery's nominal voltage rating, it is impossible to determine whether an OCV of 6.4V is indicative of a good or bad battery, or a charged or discharged battery. If the device (or the user) knows that the battery should have a fully charged voltage of 12.6V, an OCV of 6.4V indicates that the battery is substantially discharged and possibly defective. However, if the battery context parameters indicate that the battery is nominally a 6V battery, an OCV of 6.4V indicates that it can be considered to be fully charged. (It will be appreciated by those of skill in the art that this alone does not establish that the battery is in good condition, merely that it is fully charged. Additional measurements and context information are required to determine the condition of the battery.)

When using ohmic testing to determine the condition of a battery, certain context parameters must be used to determine a qualitative test result from the raw data measured by the tester. Such battery context parameters may include, for example, nominal or expected battery voltage, nominal battery capacity or rating, battery rating system, battery construction type, nominal battery size, battery manufacturer, battery chemistry, battery age, battery temperature, battery pack configuration, battery location, test point location, terminal type, terminal material, battery model, etc. In existing commercial battery testers, such context parameters are typically determined by the user and appropriate values are sequentially entered by the user into the tester.

More specifically, depending upon the test application, a critical few or many context parameters must be entered by the user before a test can be performed and qualitative results determined. This necessitates that the tester comprise a user interface for entering these values. The user interface of the typical integrated battery tester is a display screen of some type, and a keyboard, keypad, or set of buttons that the user presses in sequence to enter or select values, typically in response to prompts displayed on the screen. Through this interface the user selects appropriate context values for the test, initiates the test, and performs post-test operations, such as viewing test results, and printing or saving the results. The user interfaces provided in current commercial battery testers are typically cumbersome, requiring an excessive number of button presses, so as to be time consuming to operate. Further, current user interfaces can be confusing to operate without instructions. Both can lead to user errors and omission of critical context information.

More particularly, the process of determining and inputting context parameters into a battery tester is subject to error and uncertainty. When faced with the prompt to enter battery context parameters, the user must understand which parameters are required. The user must be able to determine those parameters from looking at the battery or other available information. The user must enter the parameters accurately and completely. Often there is simply not sufficient information available about the battery for the user to determine the basic and critical context parameters. This problem is particularly noticeable in the case of Absorbed Glass Mat (AGM) batteries. The electrical performance characteristics, and particularly ohmic performance, of AGM batteries can vary substantially from model to model and manufacturer to manufacturer. Accurate ohmic testing of AGM batteries relies on an accurate and precise understanding of the particular ohmic context parameter for that battery model. However, such information is not provided on the label of the battery. Additionally, even if the ohmic characteristic was known for a particular battery model, the same battery model may be sold in the market place under many different brands, such that it is nearly impossible to determine the origin and proper context parameters for the battery because the battery is insufficiently identified.

In practice, because of the difficulty of accurately and specifically identifying batteries, context parameters are often generalized such that broad categories of batteries are grouped together and a general context parameter setting is used for the entire category. For example, the context parameter 'battery construction type' has been generalized to consist of three basic (and visually identifiable) groups of batteries, referred to as WET, AGM FLAT, and AGM Spiral. The user will select the closest of these battery type groups based on visual inspection of the battery. However, the ultimate accuracy of the analysis is severely constrained, because every battery has particular battery type characteristics that, if identified correctly, could be used to determine a much more accurate battery test result. Ideally, a unique construction type parameter would be provided for each battery model that reflects the very specific characteristics of that battery.

The identification of specific battery type characteristics is however very difficult. It is not practical or convenient for battery manufacturers to indicate specific battery type details on the battery label. Rather, only general specifications of interest to the purchaser are included on the label. Additionally, often the same battery is marketed under different brands unrelated to the original manufacturer, such that identification of specific battery characteristics is nearly impossible by looking at the label. Further, as noted above, even if the precise context parameters are identifiable by the user, the input of that information into the tester is critical and often performed incorrectly. Commonly the technician using the testing device fails to properly enter the information, such that one or more context parameters are omitted or entered incorrectly. Incomplete or incorrect entry of context parameters leads to erroneous test results.

Presuming the context parameters have been entered into the battery tester, the user initiates a battery test. The tester will measure certain raw data parameters from the battery. Typically, only two or three raw parameters are measured, such as voltage and an ohmic value, and occasionally temperature. However, many other parameters are measurable and could be useful in determining the health of the battery, including: capacitance, reactance, inductance, fluid levels, specific gravity of the electrolyte, current, etc., and are accordingly within the scope of the invention. These raw measured parameters are then used in a complex set of algorithms to determine qualitative results as a function of the entered context parameters. These qualitative results indicate the condition of the battery and may include, for example, estimated cold cranking amps, state of charge, state of health, remaining battery life, cranking health, and others. These determined qualitative values are then compared to the context parameters input by the user in order to determine a conclusion, typically a pass or fail condition. These calculations are performed using a microprocessor and are typically displayed on the screen of the user interface, and may be printed or saved in a memory on the device for future reference. In the vehicle battery context, it is also known to start the engine of the vehicle and measure the minimum voltage across the battery during cranking, indicative of battery health, and to measure the voltage and current ripple after the engine starts, indicative of alternator performance.

In more complex battery testing environments, for example, testing a parallel pack of batteries, or testing and comparing multiple batteries in a series string of batteries, the tester hardware and firmware must accommodate a lengthy and complex test sequence, e.g., instructing the user to perform multiple steps and then storing and comparing qualitative and quantitative results from numerous tests.

As battery testing has evolved and the results of battery tests are becoming more important in the process of quality improvement and battery warranty management, it is desirable to be able to extract the test reports or test records from the test device so that they may be collected and further analyzed or shared, or combined with other information to provide management reports, for example. This process of saving and exchanging information is often cumbersome and expensive. Normally, providing this capability will require memory on board the device to store a large number of test records, along with an interface to allow the files stored by the device to be transferred to another device, for example, to a computer system for tracking data for a fleet of vehicles. Methods for this transfer of stored data to another device include use of removable memory cards, or of on-board memory that is readable through a data port, such as a serial or "USB" port connected to a computer. Alternative methods include a "WiFi", "Bluetooth" or other radio or infrared connection between the tester and a remote device such that test reports can be sent to a network location.

Thus, it can be seen that while the testing function of a battery tester per se is comparatively simple in that only a very few raw data parameters can possibly be determined from the battery itself, commercially available battery testers have become very complex and expensive in order to provide useful qualitative results that indicate battery condition and provide actionable recommendations for a wide variety of battery types, and furthermore in order to provide the ability of securing and exchanging results and reports, printing results, sending results to a remote device for further analysis, and the like.

Similar concerns apply in the case of other forms of specialized integrated test equipment, for example, specialized equipment for reading diagnostic data from an automobile's "on-board diagnostic" (OBD) port, equipment for verifying proper performance of telecommunications facilities, and many others. More specifically, there are numerous examples of testers of various kinds wherein the actual collection of data, downloading of status codes, performance of simple tests and the like is a simple matter as compared to analysis of the test results, receiving needed context data, providing a user interface, communication of the results to other devices, and the like.

OBJECTS AND SUMMARY OF THE INVENTION

Therefore, it is an object of this invention to provide a low cost, simplified device for testing equipment, apparatuses, or components, that is, for measuring relevant parameters of the equipment, apparatuses, or components, and for transmission of the measured values to an associated external "smart device" also useful for other purposes, that is, such as a "smart phone", tablet computer, or the like. In this way the device-specific tester can be significantly simplified, and preexisting capabilities of the smart device can be "leveraged", i.e., put to additional use.

The smart device may be configured with software to perform analysis of the parameters derived from the test or it may be configured with software for connecting with a remote web server, so that the web server performs the analysis based on the parameters derived from the test. A tester according to the invention thus comprises a simplified testing device, an appropriately smart device, and optionally an appropriately programmed remotely connected web server.

In the battery testing context, the simplified battery testing device measures the basic battery parameters of interest—typically open circuit voltage, an ohmic value for the battery's internal resistance, and temperature—and sends this raw data in any convenient manner to the smart device for analysis, interpretation, results determination, and any further processing of test data. More specifically, in this way, the external smart device, not the battery testing device, is provided with memory, a user interface for capturing battery test context information, and circuitry for displaying, storing, and transmitting results and test reports.

The external smart device as noted is also useful for other purposes, such that it is not dedicated to the sole purpose of battery testing per se. More specifically, the external smart device can be a "smart phone", tablet computer, laptop computer or the like. Thus separating the function of the prior art battery testers between the simple, low cost battery testing device and the preexisting external smart device according to the present invention has many advantages discussed in further detail below.

Summarizing, these advantages include: substantially reduced cost of the battery testing device, as the dedicated test circuit can be very simple; allowing input of the context parameters by means of the sophisticated user interface already provided by the external smart device, simplifying this task for the user; allowing employment of the memory and computational capabilities of the smart device to carry out the analysis of the raw data; and allowing employment of the sophisticated communication capability of the smart device to provide convenient communication of basic data and context information, or analyzed test results, to a remote device. Furthermore, according to the invention the image sensor comprised by such smart devices can also be employed for several purposes, as detailed below.

Noting as above that the testers of the invention have applicability to uses other than battery testing per se, stated somewhat differently, distribution of the data measurement and analysis functions between a simplified testing device and a preexisting smart device capable of other uses allows "leveraging" of the capabilities of the smart device, which are generally far more sophisticated than prior art integrated testers. This allows a technician, for example, who will typically have a smart device for personal and business use, to employ this device together with one or more simplified testers, each dedicated to simply obtaining useful raw data from a variety of different equipment, apparatuses, or components.

For example, it is easy to imagine an auto mechanic to have (or be provided with) a simplified battery testing device and a different simplified device for connection to the "on-board diagnostic" (OBD) port provided on modern vehicles for downloading various items of data useful in verifying vehicle operation and tracking flaws. Both would read raw data and transmit it to a smart device for analysis. Equipped with these and a smart device, the mechanic could avoid the cost of purchase of a separate integrated battery tester and OBD test equipment, saving substantially on the cost of needed tools. Further, the smart device would be useful for all the purposes for which such devices are used, personal as well as professional, so that the cost of the smart device would not be attributable to the mechanic's tool budget.

Referring back to an embodiment of the invention wherein the simplified testing device is dedicated to battery testing (but recalling always that the invention is not so limited) in order to further explain the objects and advantages of the invention, and noting that many of these objects and advantages are not limited to battery testing, but may be useful in testing various sorts of equipment, apparatuses and components:

It is an object of this invention to utilize the user interface, processor, memory, image sensor, communication facility, the ability to conveniently download software adapting the smart device to analysis of data provided by a simplified battery testing device, and other components and capabilities of an external smart device, not the battery testing circuit, for purposes such as interacting with the user, capturing battery context information, calculating qualitative results, and managing results, thus reducing the cost and complexity of the dedicated battery testing device.

It is a further object of this invention to utilize the user interface, image sensor, communication, and processing capabilities of a portable smart device such as a smart phone or tablet computer to perform the tasks of accepting battery context information input by a user, executing algorithms to calculate qualitative battery test results, and displaying and/or transmitting these results, thus avoiding the cost and complexity of including user interfaces, keyboards, communication systems, memory, and other elements in a dedicated battery tester, as required by prior art integrated battery testers.

It is yet another object of this invention to provide a simplified battery testing device that measures basic battery values and communicates this information to a remote smart device. The remote smart device is configured with software that prompts the user to input context information and prompts the user through a series of actions and inputs to complete a qualitative analysis of the battery. The remote smart device is configured to run any one of many different software programs, each program specifically tailored to the analysis of a particular type of battery or battery application. The remote smart device software is configured such that the software can be updated at any time to improve or modify the analysis algorithm, e.g., by a conventional software download, such that the simplified battery testing device need not be provided with the ability to be updated to provide improved results.

The remote smart device can also access data to improve or modify the test algorithm by updating the locally stored list of critical algorithm parameters, thus not requiring a software update, but only an adjustment of critical logical values. Such an update can be accomplished by simple interaction with a properly configured web server.

According to a further aspect of the invention, a simplified battery testing device measures basic battery values ("raw data") and communicates this information to a remote smart device, as above. The remote smart device is again configured with software that prompts the user for input of appropriate context information. Such context information (for example, battery model, brand, size, type, standard rating, voltage, unique ID) can be entered manually from information on the battery label, or the software can be configured to use the camera or other digital sensor or receiver to capture a battery identification code (UPC code, serial (bar) code, or other proprietary code). It is also contemplated that batteries may be manufactured to comprise a radio-frequency identification (RFID) "chip" that transmits battery identification data when activated by an accompanying RFID receiver comprised by the simplified battery tester.

In a further embodiment of the invention, after the raw data and context information or a battery identifying code is received by the smart device, the smart device then communicates this collection of raw data and context or battery identifying code to a remote web server. If the raw data is accompanied by context information, the web server runs an algorithm to determine the condition of the battery based on the raw battery data and context information. Alternatively, if the raw battery data is accompanied by a battery identification code, the web server runs a program configured to retrieve battery context information for that battery from a database and then runs the algorithm to determine the condition of the battery.

According to a particular advantage of this latter aspect of the invention, the smart device need not be configured with any particular analysis algorithm, as this function is accomplished by the software on the web server. The web server runs the appropriate analysis software and returns the result data back to the smart device for presentation to the user. In this way, the software on the smart device can remain very basic, and can be focused simply on information gathering and user interface functions, while the web server application is responsible for applying the appropriate algorithms. In this embodiment, the simplified testing device provides raw battery data, the smart device provides a user interface for the collection of contextual and other test information from the user, and the web server software accomplishes all of the analytical and diagnostic tasks. In this way the cost and complexity of maintaining and improving the diagnostic algorithm is reduced because software on the smart device need not be modified or updated; all updates, e.g., as new battery types become available, are accomplished simply by updating the databases accessed by the web server. Furthermore, the fact that the software application program ("app") running on the smart device is greatly simplified, essentially serving merely to communicate data from the simplified battery tester to the web server, makes it much more straightforward to allow different types of smart devices to be employed in practice of the invention.

In a further modification, a simplified battery testing device measures basic battery values and communicates this raw data to a smart device, as above. The smart device is configured with software such as that commonly known as a web browser or other similar software that interfaces with a specific remote web server. In this embodiment, the smart device simply forwards the raw data to the server and the web server responds by presenting a "web form" to the smart device browser. The smart device then prompts the user to input context information necessary for a complete analysis. Thus, the remote web server is configured with software that causes the smart device to display one or more forms prompting the user to input appropriate context information, and after the form or forms are completed, the web server performs the analysis using the raw battery data and context data provided by the user. In this embodiment of the invention, the smart device need only be configured with basic "web browser" software to provide a connection to the web server; no dedicated application (or "app") need be provided on the smart device.

In still a further embodiment of the invention, a simplified battery testing device measures basic battery values and displays those values in human readable form. The user can then simply input the raw data into a typical web browser (that is, running on a typical personal computer) configured to accept the input of basic battery values and context data. The web browser then provides this information to a remote web server. The web server software is configured to apply the appropriate algorithms to the entered data and return the test results to the browser. In this way, it is possible to bypass the smart device entirely.

A particular advantage of the present invention is that because the simplified testing device only produces raw data, the need to improve its performance or update its capabilities—e.g., as new types of batteries become available—is very unlikely. Accordingly, the simplified testing device should remain useful for many years, even as new types of battery become available and need testing. Where the analysis of raw data is performed by the smart device, new methods, algorithms, battery applications, and context information characteristics can be adopted and integrated into final qualitative results by a simple software download to the smart device; where the analysis is performed by a web server, only the software on the web server need be updated, both without requiring any modifications to the simplified testing device. Such changes can be quickly and easily made in the software that resides on the remote smart device or on the web server, by simply updating the appropriate application software. This method vastly increases the range of battery types, configurations, and applications that can be tested using the same simplified battery testing device.

In a further aspect of the invention, a battery testing device communicates raw data to a smart device, and the smart device captures battery identifying information directly from the battery that can be used to reliably identify the specific battery model without the need for the user to read and interpret information on the battery label and input that information. Using the battery identifying information, specific battery context values important for accurate battery testing are accessed in a database and provided to the analysis and diagnostic algorithm. In this way, the battery testing device and smart device can be used to test batteries, but the user need not input any data. This simplifies operation of the tester and eliminates a frequent source of errors.

It is another object of this invention to provide a simplified battery testing device that communicates raw objective battery parameter information quickly and conveniently to a smart device using a simple and low cost method. This simple and low cost communication between the simplified battery testing device and the smart device can be accomplished in a variety of ways, each well known to the art in other fields of use.

For example, the raw battery parameter information can be quickly and conveniently transmitted from a simplified testing device to a smart device by a wired communication technique, such as serial communication carried out using the well-known USB communication technique. Alternatively, the raw battery parameter information can be transferred quickly and conveniently from a simplified test device to a smart device using a wireless communication interface such as those used by the well-known "WiFi" or "Bluetooth" radio communication technique. Such wired and radio communication techniques are supported by today's smart devices and can readily be implemented in a simple battery testing device.

However, both wired and radio communication techniques are subject to certain possible complications; the cables needed for wired communication can be lost or damaged, and the standards for WiFi or Bluetooth radio communication may vary over time. If these could be avoided in favor of a simpler communication technique—noting in particular that there is no reason for there to be communication from the smart device to the simplified battery testing device, only in the opposite direction—a further advantage would be provided.

Therefore, it is a further object of this invention to provide a method of transferring raw battery parameter information from a simplified battery testing device quickly and conveniently to a remote smart device in a manner avoiding a wired data or communication bus, or a radio transmission technique. Such a method allows for a very low cost and trouble free battery testing device.

According to this latter aspect of the invention, raw battery parameter information is transferred from a simplified battery testing device to a smart device by enabling the simplified testing device to display a graphical image such as a bitmap image that is optically recognized by a smart device. As the conventional smart devices now all include an image sensor and are capable of employing sophisticated software for recognizing such bitmaps and reading data therefrom, providing the communication from the simplified battery testing device to the smart device in this manner does not involve any complication of the functions already provided by the smart device; the battery testing device need merely be capable of displaying a bitmap including the raw data in a form recognizable by the smart device, which is a simple matter.

One well-known form of such bitmaps is known in the industry as the "QR" code, which is conventionally used to transfer characters from, for example, a printed publication to a smart device. For example, a user may use the camera of his or her smart phone to scan a QR code in a magazine advertisement; the QR code commonly stores a web address, which can then be immediately employed by the smart phone to access the advertiser's web site. Such QR codes can be readily generated to encode raw data—for example, measurements carried with respect to a battery to be tested—and displayed on a screen of a simplified battery testing device, and read therefrom by the smart device. Therefore, it is an object of this invention to quickly and conveniently transfer raw battery parameter information from a simplified battery testing device by enabling the simplified testing device to display a QR code that includes the battery parameter information. The QR code is visually captured by an image sensor or camera of the remote smart device. The smart device then employs the raw data communicated by way of the QR code and the battery context information input by the user to evaluate the battery, as discussed above.

It is also within the scope of the invention to collect plural sets of raw data and transmit these from the simplified battery testing device to the smart device in separate operations. For example, the simplified battery testing device can measure voltage, temperature and resistance and display a QR code with those three values, and then wait for an engine starting sequence. If it senses an engine starting sequence, it will capture the cranking voltage (that is, the minimum voltage reached by the battery during engine starting), alternator voltage, and alternator ripple. After it gathers these values, it will generate and display a new QR code that includes these additional values. The smart device will receive the QR codes in sequence, analyze the data, and display the qualitative result.

It is also within the scope of this invention to have the simplified battery tester display a QR code whereby the battery parameter data information is accompanied by address information such as a web address, or a specific internet protocol (IP) address, such that a smart device or other any application receiving that code can directly relay the entire string of information to a specific web server configured to analyze the connected battery parameter data. An example string might be 'http://www.testdata.com/?/Xb342C12a5d2h331×4f'. In this example, www.testdata.com is the address for the web server where the diagnostic algorithm software is located, and the following string contains some or all of the data necessary to determine a diagnostic result. Using this method avoids the need for the smart device to contain the diagnostic software. Rather the smart device only needs be able to relay the test data string to the web server and display results returned from the web server.

It is desired to prevent unapproved software applications to utilize the measurement values produced by the simplified battery testing device—that is, it is desired to prevent unauthorized vendors from selling software for smart devices that will allow them to interact functionally with the simplified battery testing device of the invention. Accordingly, it is a further object of this invention to transfer the raw battery parameter information from a simplified battery testing device to a remote smart device after first encrypting the raw battery parameter information into a series of values that are not directly representative of battery measurements, then converting these encrypted values into a graphical image that can be scanned by a remote device. In this embodiment of the invention the remote smart device includes software that is enabled to decrypt the data such that the values can be analyzed as a function of battery context information and used to determine qualitative battery performance information.

In a further embodiment of the invention, existing wired interfaces in a vehicle may be employed to minimize the number of connections that must be made between the battery being tested and the smart device. One such method is to use the existing DC power wiring in the vehicle to communicate the raw battery parameter information. By utilizing the existing power wiring in the vehicle, the battery tester, which is connected to the battery, which is also connected to the wiring of the vehicle, can transmit the raw battery parameter information using any one of many possible protocols throughout the DC wiring of the vehicle. A receiving device connected to the DC power wiring, remote from the battery tester, can then receive the battery parameter information communicated over the DC wiring.

More specifically, modern vehicles all include an On Board Diagnostic (OBD) port. An "OBD scan tool" is connected by a technician to the OBD port to detect vehicle operating data, fault codes and the like. The OBD port connections include the DC power wires (B+ and ground), and are thus connected directly to the battery. The simplified battery testing device can be connected to the battery, perform the desired test, and then transmit the raw data over the power wiring to the OBD port. A typical OBD scan tool can be configured to receive the raw data. In this way, the raw battery parameters can be transferred by the properly configured OBD scan tool to a remote device using any one of many communications methods already used by OBD readers. Such methods include Bluetooth, WiFi, and direct wired communication, but could also include the display of an optical code, as described above.

It is an object of this invention to improve the accuracy and reliability of battery measurements by automatically measuring one or more battery attributes more than once and automatically comparing results to ensure that the measured values are consistent within an acceptable range. If the results are consistent within an acceptable range, the values of the sequentially measured results may be automatically averaged to produce an average value, or otherwise statistically modified to produce a result that is most representative of the true measurement. If the sequential results are not sufficiently consistent, then the simplified battery testing device will automatically measure the attribute n more times, where n could be any value of one or greater, and the results further analyzed for consistency. If the results are not sufficiently consistent, the testing device may clearly indicate a failed test on the display, or generate a graphical code that when scanned by a remote device indicates a failed test so that the user can initiate a new test.

It is an object of this invention to quickly, conveniently and accurately capture battery context information on the smart device, such that the software of the smart device can accurately process the raw data from the simplified battery tester without the need for the user of the tester or the smart device to interpret or enter any particular context information. This will permit automatic digital input of battery characteristics and context information, such that user errors are eliminated, as well as input of battery test data. This data is captured digitally, by utilizing RFID, optical scanning, or other digital techniques to remove the potential for user error and to decrease the total testing time.

In one embodiment, the smart device runs a software application that prompts the operator to aim the image sensor at a bar code on the battery label. The image sensor captures the bar code image and the software determines the battery identifying information from the code number. Once the battery identifying information is known, then generic or specific battery context parameters can be pulled from a local database stored by the smart device containing a large list of battery identities and their associated context parameters, or downloaded from a remote server maintaining such a database, and used in the analysis of the battery being tested.

The battery identifying information may be simply the well-known universal product code (UPC) or any other proprietary code optically readable by the smart device. Alternatively, the battery identifying information may be stored digitally and transmitted and detected as a radio code, e.g., using well-known radio frequency identification (RFID) techniques. For example, the battery manufacturer may implant an "RFID chip" in the battery at manufacture, and the battery ID retrieved by an RFID receiver in the simplified battery tester and transmitted to the smart device by any of the methods described above.

The battery identifying information allows the battery to be identified as a specific battery model. As noted above, in prior art battery testing methods, the battery model information is generically related to one of a few battery 'types', referring to battery construction or design, for example, wet, maintenance free, Absorbed Glass Mat ("AGM"), gel cell, etc. Each battery 'type' is associated with one or more generic conversion characteristics used by the analysis algorithms to convert raw battery information into commonly understood battery performance measurements, such as cold-cranking amps (CCA), cranking amps (CA), or ampere-hours (Ah), for example.

However, for all battery types, and particularly for AGM batteries, the generic conversion characteristics are only approximations and are inherently inaccurate compared to a conversion characteristic specific for a particular battery model.

In one embodiment, the smart device is configured to contain specific context details, including diagnostic algorithm details, and specific conversion characteristics, or battery type factors, for specific battery models. Once the specific battery model is known, the specific battery context details can be used to determine the test results. In this way, the algorithm for testing a specific battery can be customized very precisely to the specific battery model being tested, improving diagnostic accuracy.

Specific battery context details for a battery model can include items such as customized battery type factors, reference performance values based on one or more test standards, battery brand, battery model name and number, battery construction, warranty period, expected end of life parameters, and any other information about a battery model that could be useful in evaluating the performance and health of a battery.

If the battery is configured with a code that is unique to a specific battery, such as a serial number, additional identifying information can be determined from the serial number. For example, the serial number can be scanned optically, and then decomposed into components that may include battery brand, battery model, unique battery ID number, manufacture date, formation date, factory of origin, or any other data encoded in the code by the battery manufacturer. The software of the smart device can determine the specific information contained in the code, or the software of the smart device can be configured to transfer the code to a web server that is configured to identify the code type and, based on the code type, determine the specific information components and values in the code. The web server would then return that information to the smart device along with relevant specific battery test parameters to be applied to analyze the battery.

In this way battery manufacturers can maintain, modify and update the critical parameters and testing thresholds by which their batteries are evaluated. By modifying the parameters in a database maintained by a web server, subsequent testing performed in the field will be performed according to the updated parameters. This facility allows for very efficient and quick rollouts of adjustments and improvements without needing to update the firmware that is hard-coded into most battery testers, and even avoids the relatively seamless process of updating the software on smart devices, as the updated parameters will be used by the smart device software as soon as the master parameter database maintained by the web server is updated.

It is a further object of this invention to quickly and conveniently add useful identification information to a test record such that the test report can be easily attributed to a particular battery, vehicle, installation, location, building, or other useful identifying attribute. This can be easily done by adding such identifying information through the use of hardware and software capabilities that already exist on a smart device.

For example, in the vehicle context, either before or after the remote smart device scans the display of the simplified battery testing device to capture the graphical code containing simplified battery measurements, the software on the remote smart device can prompt the user to add identifying details of the battery or vehicle. These details could include the vehicle identification number (VIN), which can be optically scanned or photographed by the image sensor of the remote smart device, and then stored in conjunction with the battery condition information for later use. In this connection, the scanned image of a human-readable version of the VIN can be converted by the software, using optical character recognition, to an alphanumeric string representing the vehicle identification number and stored as a field together with the other data associated with the battery. Alternatively, the VIN number may be provided on the vehicle in bar code form that can be scanned by the image sensor of a remote device and converted to an alphanumeric code.

The VIN can be correlated to a specific vehicle make and model using a database located within the smart device, or accessed on a web server via the internet. The make and model of a vehicle can be correlated with specific context details that can be used to improve the accuracy of the diagnosis. For example, the VIN can be used to determine the factory specified battery for a vehicle, and the reference values for that battery can be used as context information for that vehicle.

Such information concerning the characteristics of a specific vehicle can also be used to address another common problem, as follows. It is particularly difficult to test batteries that are located in remote compartments in the vehicle. Often batteries are located under a seat or in a remote compartment that is not easily accessible. In this circumstance, remote battery posts are provided in a convenient location for the purpose of jump starting, or to allow basic battery diagnostic procedures. However, ohmic tests of a battery made at the remote posts are distorted by the resistance created by the connections between the battery and the remote posts that are used for testing. If the resistance of the particular configuration is known, then an adjustment can be applied to the test results to achieve an accurate diagnosis. A database of such adjustment factors for each vehicle can be created, and when the VIN is scanned, the smart device or web server can look-up and apply the proper adjustment factor to achieve a highly accurate test result.

Other useful identifying information that can be similarly captured and stored with the test report includes a battery bar code, serial number or part number, a photograph of the battery, the vehicle license plate number, the number of a vehicle belonging to a fleet of vehicles, the location of the test as determined by an on-board global positioning system (GPS) device in the remote smart device, a photographic image of the installation of the battery, or any other information that is useful to identify the battery being tested.

It is yet a further object of the present invention to integrate battery test report information automatically with other service information related to a particular vehicle in a service setting. After simplified battery measurement information is obtained by the remote smart device and converted into battery condition information as a function of the context information, a battery test report is created. This battery test report includes battery identification information that can be correlated with a particular vehicle or owner. By using one or more related identifying values, the battery test report can be automatically combined with other records related to the same vehicle, vehicle type, or owner.

As mentioned above, while described principally herein in the context of battery testing, the invention has applicability to testing of numerous forms of equipment, apparatuses, and components. In each case, a simplified testing device will be connected to the equipment, apparatus, or component to be tested, will measure raw data, collect stored data, and perform similar operations to ascertain raw data that can be analyzed to determine the condition of the equipment, apparatus, or component, and will then transmit the raw data to an associated smart device. The smart device will then perform the analysis, typically after input of context parameters indicative of the normal operation of the equipment, apparatus, or component, and provide useful output. Again, in this way the cost of the testing device can be minimized, and the highly sophisticated analytical, display, user interface, image capture, data storage, software update, and communication capabilities of the smart device can be leveraged over numerous uses.

Other aspects and attributes of the invention will become apparent to those of skill in the art as the discussion below proceeds.

BRIEF DESCRIPTION OF THE DRAWINGS

The invention will be better understood with reference to the accompanying drawings, in which:

FIG. 2 shows a view of a screen of the simplified battery testing device illustrating a typical QR code, readable by a remote smart device;

FIG. 3 shows a block diagram of the components of the simplified battery testing device;

FIG. 11 shows a flowchart of the steps taken in battery testing using the system of FIG. 10.

DETAILED DESCRIPTION OF THE PREFERRED EMBODIMENTS

Figure 1:
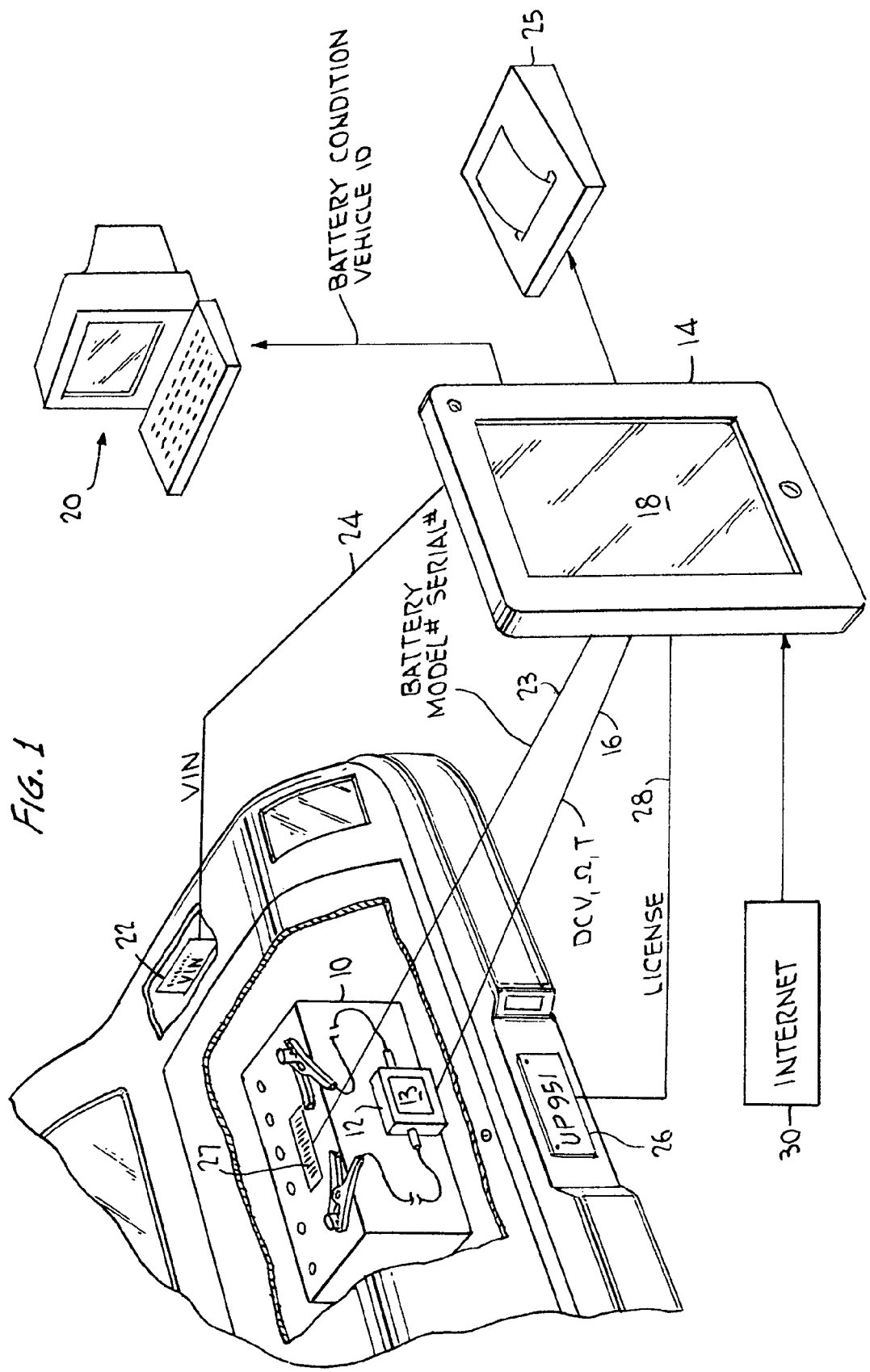
FIG. 1 shows an overall view of a battery tester with distributed measurement and analytical functions according to the invention.

As mentioned above, FIG. 1 shows an overall view of a tester with distributed measurement and analytical functions according to the invention. The tester is shown in the context of testing a vehicle battery, but the invention is not limited thereto, as more fully detailed below.

As discussed above, the basic function of measuring battery parameters, typically the open-circuit voltage (OCV), ohmic value and temperature of a battery 10 is carried out by a simplified battery testing device 12, when "powered-up" by being connected to the battery 10. The technique employed for measuring the ohmic value may be generally as described in the Huang patents referenced above, and as summarized below, or otherwise. Values other than those mentioned may also be measured, as noted above.

In a more sophisticated test, the user may be prompted to start the vehicle's engine after the basic parameters mentioned above have been measured. This will result in additional measurements, typically the minimum voltage measured across the battery during cranking of the engine, useful in evaluating the battery, and the voltage and ripple frequency detected after the engine starts, useful in evaluating the alternator. The steps involved in performance of these tests are described below with reference to FIG. 4.

After the tests supported by the simplified battery testing device 12 have been performed, as above, the simplified battery testing device 12 then transmits this raw battery parameter data to a smart device 14, as indicated at 16.

Such smart devices 14, typically including the devices known colloquially as smart phones or tablet computers, and including therein other devices with the capabilities required, have several built-in features that are employed in implementation of the invention. For example, such smart devices include image sensors, which are connected to image processing circuitry and software such that they can decode symbols such as a so-called QR code, yielding an alphanumeric string of letters and numbers. These smart devices are also provided with memory and significant processing power, with the ability to download software (commonly referred to as an "app", for "application") adapting the device to a new use, and with the ability to communicate in any of several ways. Thus, in order to adapt a preexisting smart device for use in connection with the present invention, one simply need download appropriate software, for example, software implementing the steps discussed below.

As mentioned above, the raw data can be transmitted from the simplified battery testing device 12 to the smart device 14 in any of several ways, including wired or radio connection. At present the preferred method is by way of display of an encoded version of the raw data on a screen 13 of the battery testing device 12, e.g., in the form of a QR code (see FIG. 2), and read therefrom by an image sensor or camera comprised by the smart device 14. The smart device 14, having been provided with battery context information such as the battery rating (for example, by user input via a touch screen 18), then analyzes the raw data according to a stored algorithm, and determines the battery condition.

The smart device 14 can be configured to optically capture a bar code 27 or other code on the battery 10 containing battery identifying information. Alternatively, the smart device 14 can use other methods of capturing battery identifying information from the battery. For example (and as discussed further below in connection with FIG. 6), the simplified testing device 12 can comprise an RFID receiver which can receive information from an RFID chip that is provided by the manufacturer as part of the battery 10. The information received from the RFID receiver in the simplified testing device 12 can be transmitted to the smart device 14 along with battery test information in any of the ways described herein. Once the battery identifying information is received, the smart device 14 is enabled to select specific battery context information for the particular battery being tested. The smart device 14 may be provisioned with a database of specific batteries and the corresponding context information for each, or the smart device 14 may communicate the battery identifying information to a remote web server as indicated at 30 where context information for that specific battery is available; the web server then returns the appropriate battery context information to the smart device 14 for calculation of battery condition results.

Optionally, the smart device 14 may transmit the battery condition data to a remote computer 20, e.g., to the service bay workorder system of a dealership or service center. In that case the smart device 14 will preferably also transmit vehicle identification data, such as the VIN, readable by the smart device from the label 22 provided on all vehicles, as indicated at 24, or the vehicle's license plate number 26, likewise readable by the smart device 14, and as indicated at 28. The battery condition data and other identifiers can alternatively or additionally be printed via printer 25.

As noted above, the smart device 14 will normally require battery context information, typically including battery type and the battery's nominal specifications, and the battery rating system to which the specifications refer, in order to perform its analysis. This information is normally printed on the battery label. The user can input this information directly, responsive to prompts displayed on the screen of the smart device. Alternatively, the smart device may obtain this data by user input of a battery identification, such as the part number, followed by downloading the battery's specification from the internet, e.g., from the battery manufacturer's web site, as indicated at 30. The smart device 14 may also be enabled to read the battery's identification from a bar code, RFID memory device or like identifier 27 on the battery 10, where provided, and likewise obtain its nominal specifications and other context information from a database maintained by the web server if the relevant specifications are not already contained in the RFID info or bar code.

As noted above, in most cases, batteries are grouped into major 'type' categories—e.g., "wet", "VRLA" or maintenance-free, and AGM—that exhibit common ohmic behavior. This has been advantageous because the user can reasonably expect to determine the general type of a particular battery by inspection. The battery tester, or in the case of this invention, the smart device 14, is typically provided with specific algorithmic values that are generically accurate for testing each type of battery. However, it has been found that there are differences in ohmic performance of batteries within a type category, notably the AGM type. If a specific battery can be tested using specific algorithmic values appropriate for that model, testing accuracy will be improved. By enabling the smart device to specifically identify a battery as described above, the smart device can download not only battery specifications, but particular algorithmic parameters for that specific battery model. Downloadable information might also include a specific battery type factor, battery warranty period, and other useful attributes that cannot be readily observed.

FIG. 2 shows a schematic view of the simplified battery testing device 12 according to the invention. As illustrated, device 12 comprises a central unit 32, which contains the circuitry necessary to carry out the functions described, as discussed in more detail below in connection with FIG. 3, a display 13, and positive and negative spring clamps 34 and 36 for being conveniently attached to the poles of a battery 10, as illustrated in FIG. 1. Clamps 34 and 36 are connected to the internal circuitry of device 12 by cables 38 and 40, as conventional. Clamps 34 and 36 and their associated cables 38 and 40 may implement so-called Kelvin clamps, as commonly used, comprising separate conductors for signal-level currents, such as the voltage across the battery 10, and heavier currents, such as the current drawn when a load resistor is connected across the battery in order to measure its internal resistance. See the Huang patents referenced above. One of clamps 34 and 36 may include a temperature sensor 42 for measuring the temperature of the battery 10.

FIG. 3 shows a block diagram of the components of the simplified battery testing device 12 of the invention. These include a microprocessor control unit (MCU) 44, display 13, cables 38 and 40 connecting the MCU 44 to the battery 10 to be tested, and a transistor switch 46. As noted above, cables 38 and 40 may terminate in Kelvin clamps 34 and 36 respectively. Where used for other types of tests, the MCU will store and run software optimizing the tester 12 to testing a particular type of equipment, apparatus, or component, and the tester will be provided with suitable connecting components.

Figure 4:
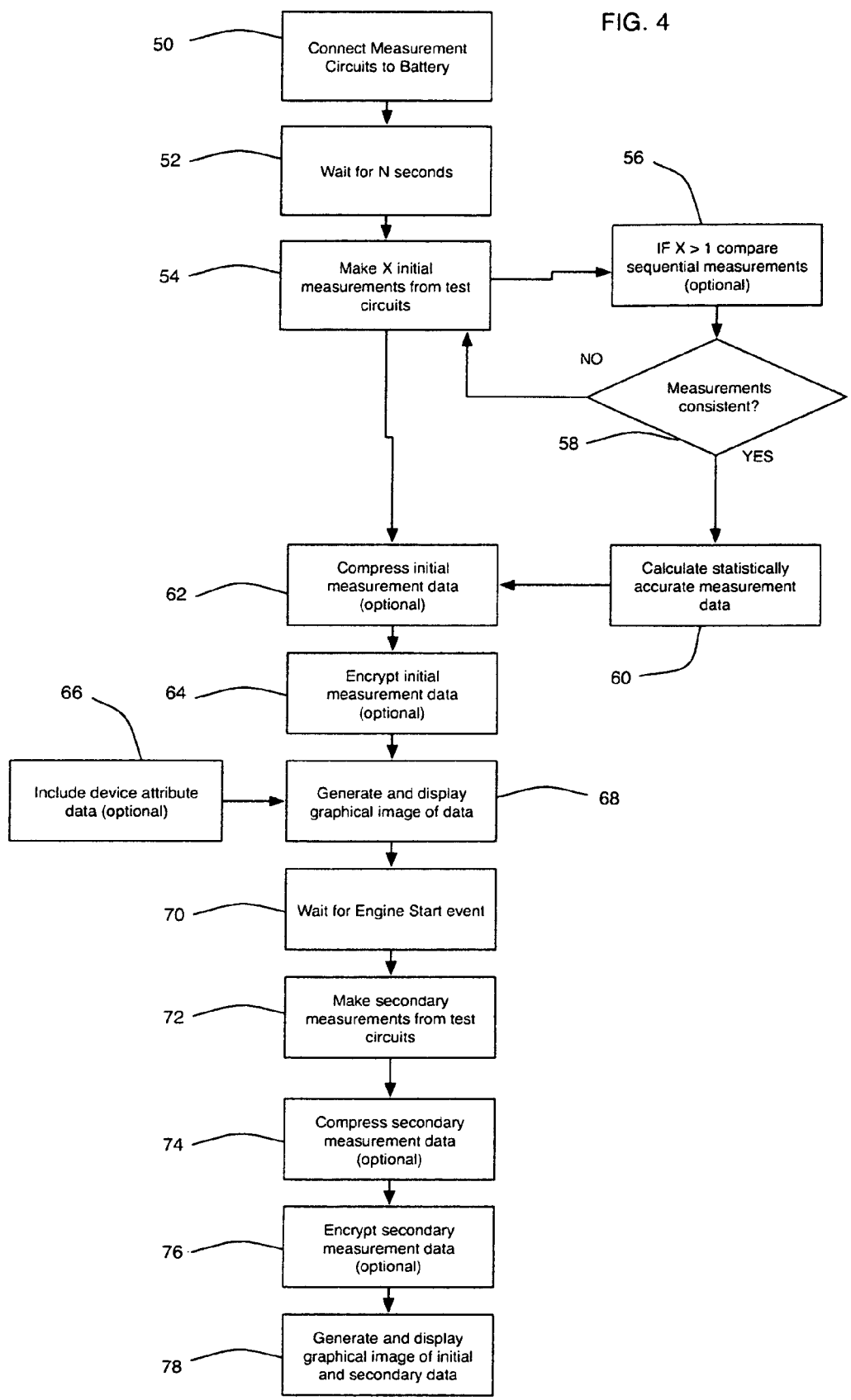
FIG. 4 shows a schematic flowchart of typical functions carried out by the simplified battery testing device of the invention.

FIG. 4 shows as mentioned above the basic steps in the process carried out by the simplified battery testing device 12 when it is connected to a battery. At step 50, the device 12 is connected; the process begins immediately upon thus "powering-up" the testing device 12. As indicated at 52, there is an initial delay for a period of N (e.g. five) seconds, to allow any transients to settle out, e.g., to make certain that the clamps 34 and 36 are in good contact with the terminals of battery 10.

At step 54, the device 12 carries out a number X of identical measurements of fundamental parameters of the battery 10. As discussed above, these measurements will typically include an initial measurement of the open-circuit voltage (OCV) across the battery. A "ohmic" value for the internal resistance r of a battery 10 then can be derived by measuring the voltage $V_B$ (equivalent to OCV) across the battery, employing contacts 47 and 47', connecting a load of known resistance R across the battery for a short period of time by closing switch 46 so that a single short pulse of large current I is drawn from the battery, via contacts 43 and 43', and measuring the voltage $V_R$ across the load R employing contacts 45 and 45', while again measuring the voltage $V_B'$ across the battery. The current I drawn from the battery is then calculated by $I=V_R/R$, and the internal resistance r of the battery calculated by $r=V_B-V_B'/I$. Again, see the Huang patents referenced above, noting that the invention is not thus limited. The result is values for the OCV and internal resistance; the temperature of the battery 10 may also be measured, employing contact 42, as noted.

As indicated by steps 56, 58, and 60, the measurement step 54 can be repeated a number X of times, to ensure accuracy.

When the measured battery parameter data thus determined is deemed reliable, it may be compressed, as indicated at step 62, and may be encrypted as indicated at step 64, before being transmitted at step 68. The compression and encryption steps may take the form of transforming the data, as measured in a base-10, decimal format, to a different format, e.g., hexadecimal format. This has the effect of reducing the number of characters that need to be transmitted—thus providing a data compression function—and also to render the data transmitted (again, by way of a QR code or the like) much more difficult for an unauthorized user to decode—providing an encryption function. More specifically, any smart device can read the QR code and obtain from this an alphanumeric string, but without specific knowledge of the algorithm needed to transform this string into data representative of the measured battery parameters the alphanumeric string per se is useless. In addition to the battery parameter data, an identification of the simplified battery testing device 12 may be transmitted, as indicated at step 66. This would typically include the model and serial numbers of the device 12, and the software version it is employing.

Where the battery tester of the invention is being employed to test a battery employed as an engine starting battery, the user may be prompted to start the engine at this point, or may simply do so after the passage of a few seconds, as indicated at step 70. The testing device 12 will then make secondary measurements as indicated at step 72; as discussed above, these will typically include the minimum voltage exhibited across the battery during starting, and the voltage and ripple frequency exhibited after starting. The former is indicative of battery health, and the latter of alternator function.

After these secondary measurements are completed the resulting data can be compressed and encrypted, as above, at steps 74 and 76, and both the primary and secondary data transmitted at 78, again preferably by way of generation of a QR code displayed on screen 13 of testing device 12.

It is to be understood that while a QR code is at present the preferred form of code to be used to transfer data from the simplified testing device to the smart device, other forms of optically machine-readable data transfer formats may be used and are accordingly within the scope of the invention. For example, a single-dimension code such as a bar code can be used, or other forms of two-dimensional "bitmaps", comparable to the QR code, may be used. Accordingly, reference herein to use of a QR code is to be understood to include other forms of code suitable for the purposes mentioned.

Figure 5:
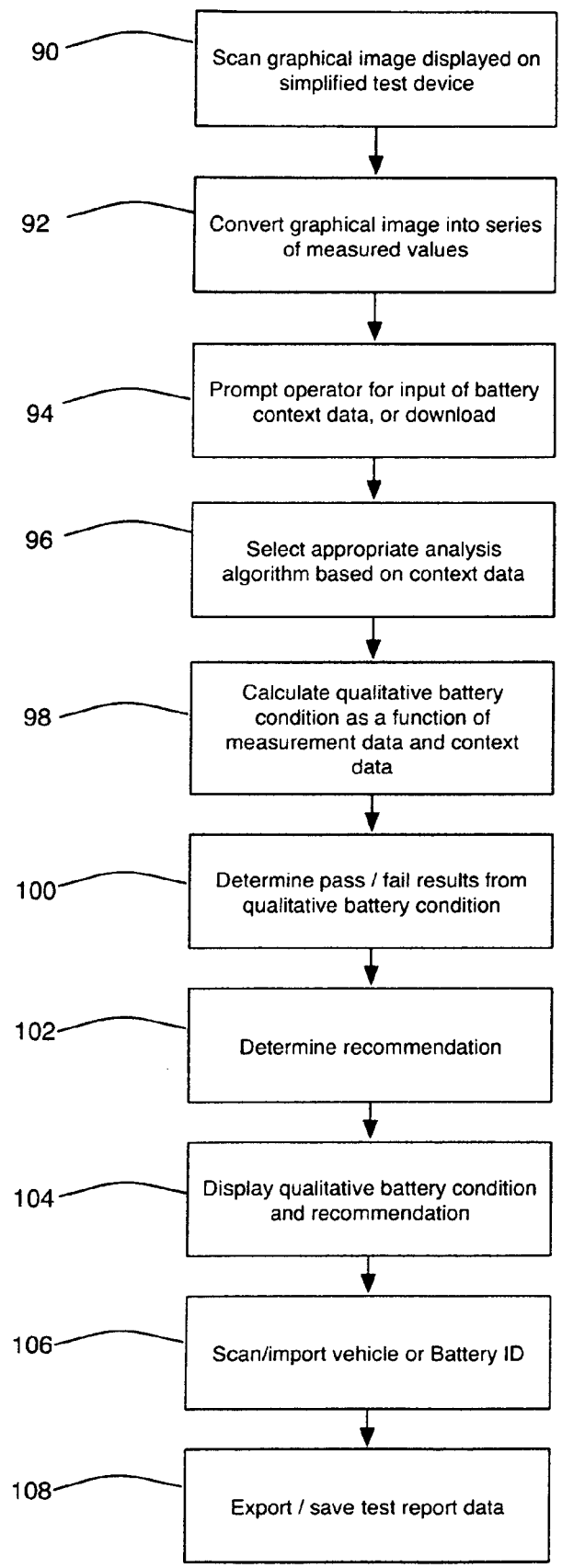
FIG. 5 shows a flowchart of typical analytical software employed by the remote smart device to analyze the measured battery parameter information.

FIG. 5 shows the principal steps performed by the smart device 14 in receiving the raw battery parameter data measured with respect to a specific battery 10 under test from the simplified battery testing device 12, analyzing the data with reference to context parameters describing the battery's nominal characteristics, determining the condition of the battery, and communicating the results in useful form.

Thus, at step 90, and assuming that simplified battery testing device is enabled to display (possibly compressed and/or encrypted) data on its screen in code form, e.g., as a QR code, the smart device 14 scans the QR code. As noted above, all devices within the definition of "smart devices" as used herein have (when the corresponding app has been downloaded) the capability of thus scanning QR codes and converting the QR codes to an alphanumeric string. This is performed at step 92; if the raw data has in fact been compressed and/or encrypted, the smart device 14 will have had downloaded to it, as part of the app allowing the device to function according to the invention, the software needed to convert the QR-coded data to a series of measured values.

At step 94, the user provides the smart device 14 with the context information describing the battery's nominal specifications and other context information that are useful to determine qualitative results. This can be done in several ways. The operator can be prompted to enter key values, such as the battery's rating, that are normally printed on the battery; the operator can enter the battery part number, and the smart device can download the key data from the manufacturer's web site; or the operator can use the smart device 14 to capture battery identifying information from the battery such as by scanning the bar-coded label found on the battery, obtaining the battery part number, and then download the needed context information. Where the tester of the invention is used to regularly test a number of identical batteries, as in, for example a fleet vehicle scenario or stationary battery bank situation (discussed further below), the context information can be permanently stored in the smart device, eliminating the repetitive input step.

At step 96, the smart device selects an appropriate algorithm for analysis of the raw data, employing the context information. For example, it is known that batteries that are partially discharged can nonetheless be evaluated, but that different battery types require different "compensation curves". See McShane et al U.S. Pat. No. 5,821,756. By inputting the battery context information, such as part number, or alternatively battery type, battery rating, and like information, the smart device is empowered to select the correct algorithm for analysis of the raw data.

Thus, at step 98, the context information and the measured data are used to calculate qualitative battery condition; for example, whether the battery is healthy but discharged, fully charged but not in good condition, and the like. In step 100 the battery is determined to pass or fail this test, and in step 102 a recommendation (e.g., "battery OK" or "replace battery") is made. This information is then displayed at step 104 on the screen of the smart device.

At step 106, the smart device 14 may be used to gather additional information concerning the battery; for example, if it is installed in a vehicle, the vehicle identity number (VIN) can be captured by scanning the label installed in all modern vehicles. Alternatively, the vehicle license plate information or the number identifying the vehicle in a fleet can be captured. This vehicle identification information is then stored along with the qualitative battery condition information.

Finally, at step 108, the stored information can be exported, e.g., to a service center's central computer or the like.

The graphical bitmap method of displaying battery attributes as described above can also be applied to simplified battery test circuits that are designed for semi-permanent attachment to batteries. In this embodiment, the simplified battery testing device 12 functions as a continuous battery performance monitor, and the graphical image is periodically updated to represent the most recent measurements. By scanning the device 12 at any time with a remote smart device 14, the current measurements of the battery can be captured and analyzed and qualitative status results calculated and displayed.

Further Improvements Provided by the Continuation-in-Part Application

In the foregoing portion of this section of the application, the disclosure has focused on an embodiment of the invention in which the smart device performs, among other functions, the analysis of the raw data received from the simplified tester; that is, the smart device is provided with the algorithms necessary to process the raw data and battery identification information in order to evaluate a battery. In earlier sections of the application, reference was briefly made to further embodiments in which the smart device is employed somewhat differently, and in which the processing of the raw data is handled differently. These will now be described in detail. Additional improvements will also be discussed.

In a first further embodiment, termed the "web client" embodiment, the smart device again is provided with an application program or "app" which comprises software that enables the smart device to effectively control the collection of raw data from the simplified test device, but in which the raw data is communicated by the smart device, acting as a "web client" in current parlance, to a remote computer, operating as a "web server", again in current parlance, which analyses the raw data and communicates the result of the test to the smart device, and performs other functions, such as storage of the data for long-term predictive functions and the like. Thus, in this embodiment the smart device is again provided with software that prompts the user to scan the screen of the simplified tester to obtain raw data, to scan the bar code or UPC on the battery to obtain the battery identification data, to scan the vehicle identification number (VIN), and so forth. This data and information is then transmitted to the web server for analysis and further action.

In a second further embodiment, termed the "web browser" embodiment, the smart device need not be provided with an app specific to this use. Instead the smart device operates simply as a web browser—that is, upon activation, e.g., by scanning a QR code on the simplified tester that includes the Web address of the web server, the smart device simply accesses the web server, which in turn responds with a series of prompts to the user, as above. The smart device then displays these to the user, who takes the required actions, and the smart device transmits the results to the web server, which in turn performs the analysis.

It will be appreciated by those of skill in the art that a smart device per se is not needed in this "web browser" embodiment of the invention, as any device capable of capturing the raw data and battery identification information from the simplified battery tester and supporting a web browser function can perform the functions required.

Both these further embodiments have the significant advantage that the smart device need not be capable of performing the analysis, but serves essentially as a conduit of raw data and battery identification information to the web server, which means that the smart device need not be provided with the specific information needed to properly analyze each of the many hundreds of different battery models on the market. Instead, this information can simply be stored in a database maintained in connection with the web server, a much simpler task than providing repetitive updates of a database for downloading to various smart devices as new models of batteries become available. The second "web browser" embodiment offers the further advantage that different types of apps need not be provided to support the various types of smart devices now available.

In a further possible improvement, the battery may be provided with a device that will communicate the battery identification data directly to the simplified battery tester, which can then transmit this to the smart device via the QR code, together with the raw data as above. This would greatly simplify the process of providing reliable battery identification data to the smart device, for analysis therein as in the embodiment described first above, or from the smart device to the web server for analysis there, as in the further embodiments now described. This could be accomplished by building an "RFID chip", as employed to identify pets and other valuable animals, into the battery at manufacture. The RFID chip would be encoded to transmit an identification of the battery to a corresponding RFID receiver provided in the simplified battery tester.

Thus, according to this aspect of the invention, a Web-based battery diagnostic system is provided. In a first "web client" embodiment, a smart device running a custom app is used to capture raw test data from a simplified test device. The app can be configured to capture battery identification data by scanning a battery UPC code, or more detailed info including unique ID, or serial code, by RFID, or by user entry, and may also capture application identifying information such a VIN code in the vehicle context, or other application identifying information such as an identification of the test site.

The raw test data and battery identifying information and application identifying information are then transferred from the smart device to a remote computer operating as a web server and configured with analysis protocols and algorithms to calculate results and diagnoses based on the provided data. The web server communicates these results back to the smart device for presentation to the user.

In a second "web browser" embodiment, the user accesses a remote web server using the smart device simply as a web browser, or employs a separate device capable of service as a web browser, such as a personal computer. The web server is configured with analysis protocols and algorithms to calculate results and diagnoses based on provided data. The smart device obtains raw test data from the simplified test device as well as battery identifying information and provides these, optionally together with "application identifying information", directly to the web server. Such application identifying information may describes the specific application in which the battery is being used, for example, automotive starting/cranking, industrial backup, telecommunications backup, electric or hybrid vehicle, or marine deep cycle. Such information can be used to customize the context information that is collected and the algorithms used to determine battery condition. The web server applies stored analysis protocols and algorithms and calculates results and diagnoses based on the provided data. The results are displayed to the user in the browser.

In the first "web client" embodiment, the software resident on the smart device can be very simple and need not be frequently updated because the battery analysis algorithm is on the web server; in the second "web browser" embodiment, dedicated software/applications on the smart device can be eliminated entirely. In both embodiments, a key advantage is that the analysis software and battery information database resides in a central location and can be updated and managed with minimal complexity. Further, particularly in the "web browser" embodiment, the need to develop and maintain software applications for different mobile operating systems, such as iOS, Android, Symbian, Windows 8, etc. is eliminated.

In still another aspect of the invention, a battery tester is provided which is capable of providing useful test results without requiring any user data entry. In this case, a simplified battery test device is connected to a battery and after a specific time delay begins an automated test routine to measure battery parameters. The user need not input anything to the simplified tester. The simplified test device automatically captures data and displays the data in machine-readable form, e.g., as a QR code, and optionally in user readable form.

As noted above, in prior art battery testers, the user was obliged to read battery context information, such as test parameters, from the battery label, and enter this data into the test device. But this process is prone to error because the user may neglect to read the information, read the information mistakenly, or make errors in the entry of the data into the tester. According to an important aspect of this invention, the smart device is configured to digitally capture the battery identification information. This battery identification information could be in the form of a UPC code, or other optically-readable code, or it may be provided by a RFID chip built into the battery at manufacture.

If the battery identification information is to be provided by way of an RFID chip, then the simplified battery test device, which in this embodiment will comprise an RFID receiver, will be configured to automatically capture the RFID information of the battery immediately after the tester is connected to the battery. The simplified test device will include on its display the battery identity information that was captured from the RFID transmission, along with the raw data, e.g., by way of a QR code.

The smart device will capture the battery identity information from the optical code on the battery label or from the RFID tag after it is identified by the simplified test device, again, along with the raw battery test data. Additionally the smart device can capture vehicle or application identity information, e.g., by way of a VIN scan. The battery and vehicle identity information are used by the smart device to look up the appropriate context values and specific test variables so that a complete and comprehensive battery test and diagnosis can be executed. The database of battery context information and test parameters can be stored in the smart device, or located on a web server which is dynamically accessed to execute a look-up of the battery analysis parameters in a data base and communicate the critical parameters to the smart device.

Together these functions enable the comprehensive testing of a battery including specific battery test parameters without the need for any data entry on the part of the user. This eliminates human errors and fraud, and increases test speed.

These embodiments of the invention will now be discussed in detail with reference to the accompanying drawings.

Figure 6:
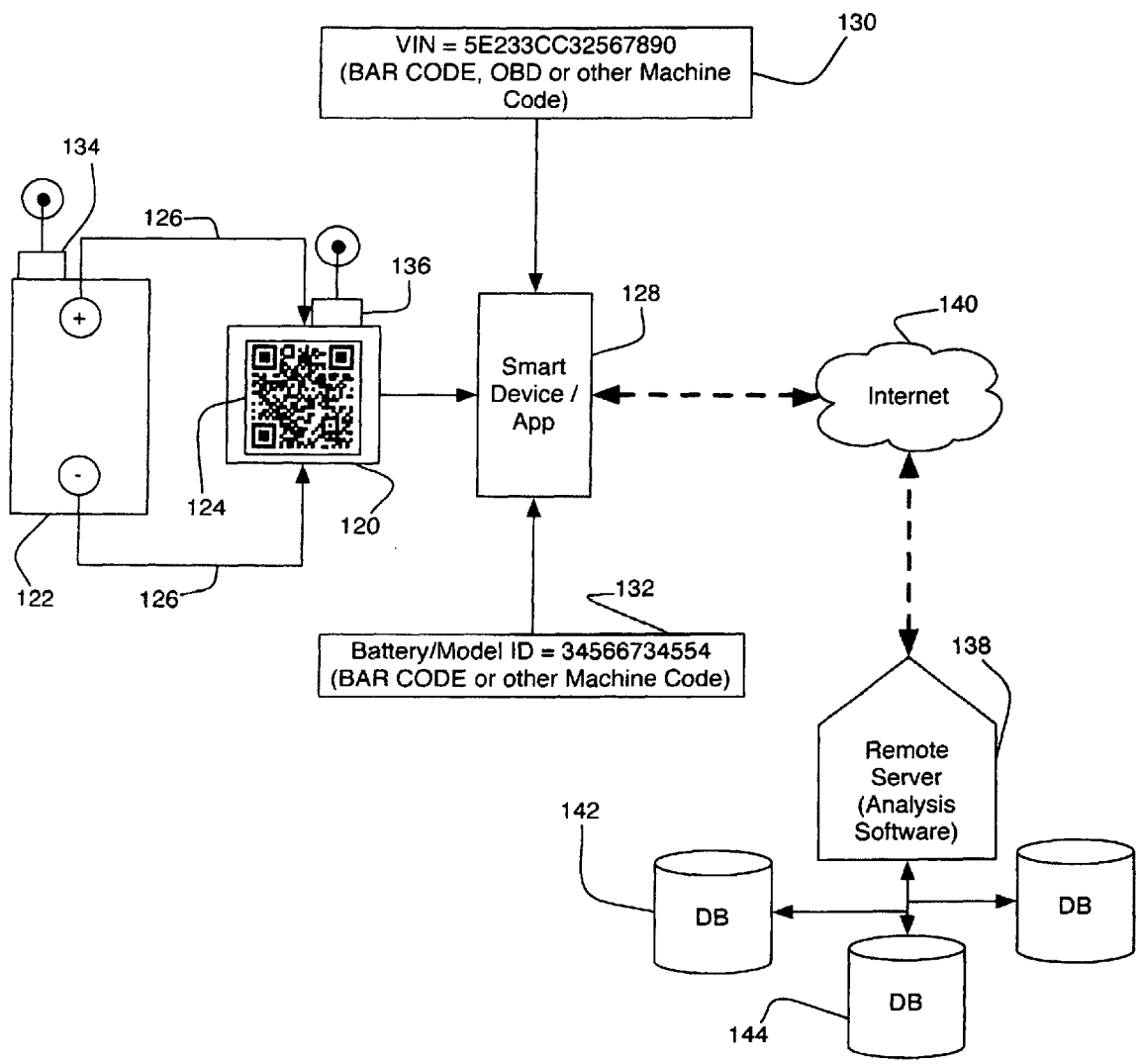
FIG. 6 shows a schematic diagram illustrating the battery tester, smart device, remote web server, and databases used in methods of battery testing described in connection with FIGS. 7, 8, and 9.
Figure 7:
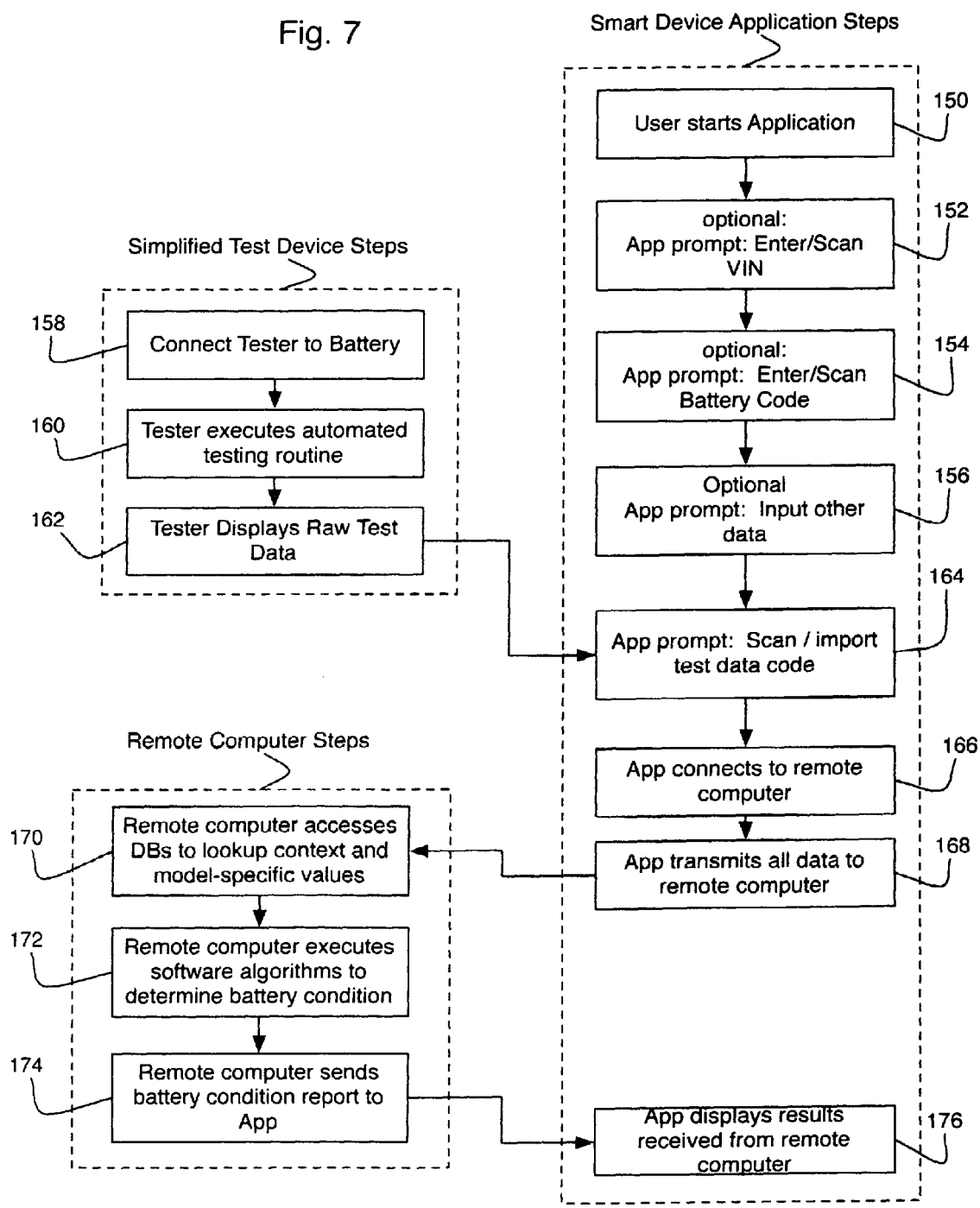
FIG. 7 shows a flowchart of the steps in battery testing wherein the analytical steps are performed by a remote web server.
Figure 8:
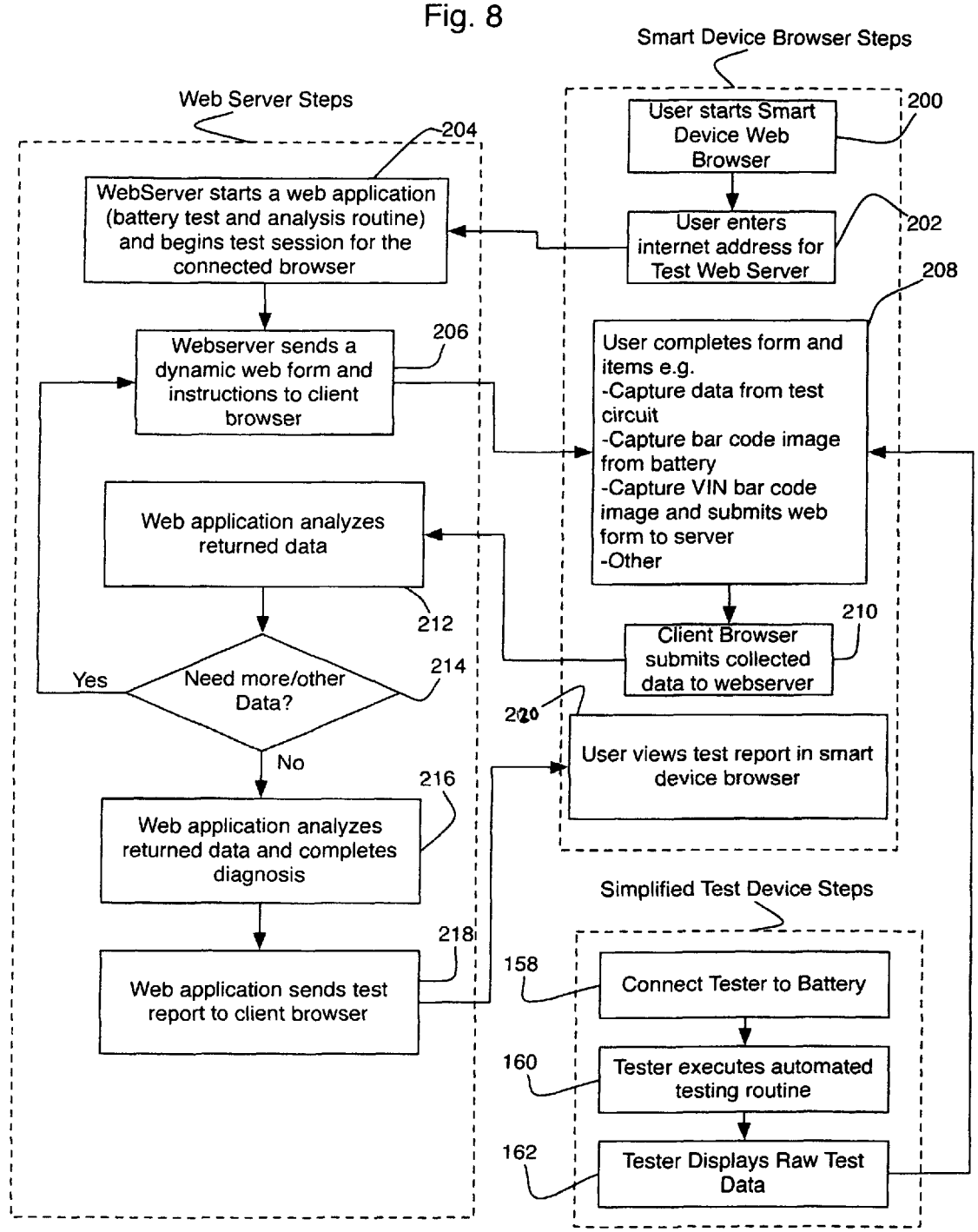
FIG. 8 shows a flowchart of a web-based battery diagnostic system, wherein the smart device is employed simply as a web browser.
Figure 9:
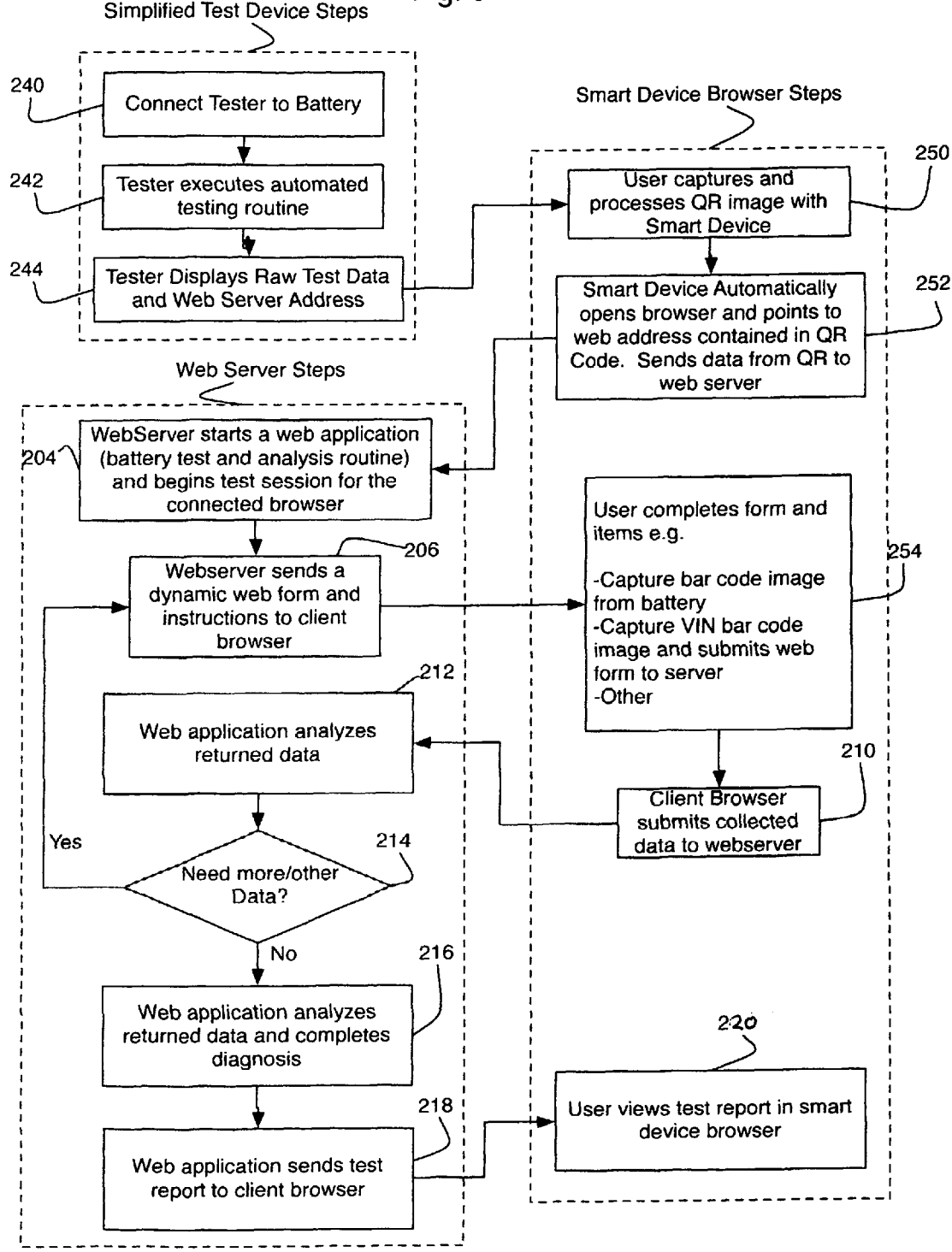
FIG. 9 shows a modification of the method of FIG. 8.

As mentioned above, FIG. 6 shows a schematic of the components employed to practice the new "web client" and "web browser" embodiments of the invention, FIG. 7 provides a flowchart of the steps in the "web client" embodiment, and FIG. 8 a flowchart of the steps in the "web browser" embodiment. FIG. 9 shows a flowchart of a modification of the FIG. 8 "web browser" process.

Thus, FIG. 6 shows a simplified battery tester 120 connected to a battery 122 by wires 126. Tester 120 performs appropriate tests as described above to generate raw data that can be analyzed to determine the condition of the battery, and generates a QR code 124 as shown. This is then read by a smart device 128. Smart device 128 will then typically prompt the user to scan the VIN or other machine-readable code indicative of the vehicle or other contextual information, as indicated at 130, and the battery identification information via a bar code, UPC, or other machine-readable code, as indicated at 132.

Optionally, the battery identification information can be provided by a RFID chip 134 provided at manufacture of the battery. This could be employed to provide a unique identifier of each battery so equipped in service, which might be very valuable. As is well known, such an RFID chip 134 transmits a unique identifying code when stimulated by an RFID receiver nearby. The stimulation can be performed and the battery identification information detected by a RFID receiver 136 comprised by the simplified battery tester 120, and the battery identifying information added to the raw data transmitted to the smart device 128 as part of the QR code 124.

The raw data and battery identification information are then transmitted by the smart device 128 over the Internet as indicated at 140 to a web server 138. In this step, the smart device 128 is acting as a web client. That is, the software app run by the smart device 128 includes the web address of web server 138, so as to transmit the raw data and battery identification information thereto. The web server then consults one or more databases 142 to determine the correct battery characteristics, performs the analysis, and sends the result back to the smart device 128 for action as appropriate.

FIG. 7 shows a flowchart of these steps in the first "web client" embodiment mentioned above, wherein the smart device 128 runs an app which causes the smart device to display prompts to the user as needed to scan the battery tester 120 to obtain the QR code, scan the battery bar code, VIN number, and so forth. Thus, in a first step 150, the user starts the application. In an optional step 152, the user is prompted to enter or scan the VIN with the smart device. In a second optional step 154 the user is prompted to scan the battery identification code (which could be the UPC or a separate bar code, or otherwise) with the smart device. If the battery comprises an RFID chip the simplified battery tester 120 can determine the battery identification therefrom, so that the user need not perform any input step to ensure this data is correctly collected. Other data, such as the site of the process, can be entered at 156.

The battery tester 120 will have been or is now connected to the battery, at 158. The tester 120 then performs the automated test routine, at 160, and displays the raw data (and the RFID battery identification data, if the battery and battery tester are so equipped) at 162. The user is then prompted to scan the QR code to obtain the raw data, at 164. The smart device, acting as a web client, then makes connection at 166 to a remote computer 138 acting as a web server, and transmits the raw data together with the battery identification information, VIN, and any other data collected to the server 138 at 168. The server then accesses the database at 170 to determine the proper battery information, such as its rating, the standard according to which the rating pertains, and one or more coefficients needed to convert measured raw data to standardized battery performance units, such as CCA, CA, Amp Hours, etc. These coefficients include the values mentioned above which varies substantially between batteries of different construction classes, and also between batteries within these classes, especially within the AGM class. The server then executes the algorithm to determine the battery condition at 172, and transmits the result to the smart device at 174. The smart device then displays the result to the user at 176 for appropriate action.

As discussed above, it is particularly difficult to test batteries that are located in remote compartments in the vehicle. Often batteries are located under a seat or in a remote compartment that is not easily accessible. In this circumstance, remote battery posts are provided in a convenient location for the purpose of jump starting, or to allow basic battery diagnostic procedures. However, ohmic tests of a battery made at the remote posts are distorted by the resistance created by the connections between the battery and the remote posts that are used for testing. If the resistance of the particular configuration is known, then an adjustment can be applied to the test results to achieve an accurate diagnosis. Database 142, 144 (FIG. 6) can include such adjustment factors for each vehicle, and when the VIN is scanned, the smart device or web server can look-up and apply the proper adjustment factor in step 170 to achieve a highly accurate test result.

FIG. 8 shows a second "web browser" embodiment, in which the smart device is employed simply as a web browser, or in which the smart device per se is eliminated in favor of another device having the requisite data entry and communication capability, e.g., a personal computer. Reference in the following to a smart device should be understood to include the latter possibility.

Thus, in step 200 the user starts the web browser function on the smart device, and uses this at 202 to access to a specific web server. At 204, the web server starts a web application program including the battery test and analysis routine and begins a test session with respect to the web browser by sending a dynamic web form and appropriate instructions to the web browser at 206. The user then sees the form on the screen of the browser and completes it at 208, typically by capturing the QR code from the simplified tester (having been connected to the battery at 158, executed the test routine at 160, and displayed the raw data at 162, all as described above in connection with FIG. 7), capturing a bar code, UPC, or RFID code identifying the battery, capturing the VIN code if applicable, or entering the above mentioned or other requested information manually into the web form. The smart device then transmits the completed form back to the web server at 210.

The web application then analyzes the returned data at 212 and sends a further query if needed at 214. When the required information has all been collected, the web application analyzes the returned data and completes the diagnosis at 216, and sends the test report to the browser at 218. This is received at 220, and the user can take any appropriate action.

In an alternative shown by FIG. 9, the simplified battery tester 120 can be provided with the web address of the web server. A test would then begin with the simplified battery tester 120 being connected to the battery 122 at 240; the simplified battery tester 120 would then perform the test at 242 and display a QR code (or equivalent) including the raw data and web address of the server, as well as the battery identification information if the battery were provided with a RFID chip, at 244. At 250, the user would then simply scan the QR code with the smart device 128, which automatically uses the address contained in the code to open a browser session with the web server, at 252. The smart device 128 would then use the web address to communicate with the web server, and the process would be completed essentially as described above in connection with FIG. 8, with the steps similarly labeled as indicated. Step 254 differs from step 208 of FIG. 8 in that the data image will have already been captured, at 250.

The above-described method of using a smart device as web browser and sending battery test data to the web server can also be employed with devices that are primarily used for other diagnostic purposes, that is, as opposed to smart phones, general-purpose tablet computers, and the like as described above. For example, various "Shop Diagnostic Platforms", essentially tablet computers provided with specific test software and appropriate connecting components and cabling, are used in workshop environments in the diagnosis and repair of vehicles.

Some of these Shop Diagnostic Platform devices differ from smart devices per se as described above in that they do not comprise components and software for capturing data optically, that is, they are not capable of reading, for example, a QR code from a simplified test device as described above. In such cases, the simplified test device is connected to the Shop Diagnostic Platform through the preexisting wiring of the vehicle, in a manner described below. The Shop Diagnostic Platform can then be employed to perform the battery diagnosis itself, or can be used to carry out either the web client embodiment or the web browser embodiment of the method of the invention. In this configuration, various pieces of information, such as the VIN or other data will already be available to the Shop Diagnostic Platform through previous testing procedures, such as executing an On Board Diagnostics scan and extracting information from the vehicle computer. In this case, some of the information required for performance of the battery testing algorithm may be shared between the vehicle diagnostics application and the battery testing procedures to facilitate a test with less interaction from the user.

Figure 10:
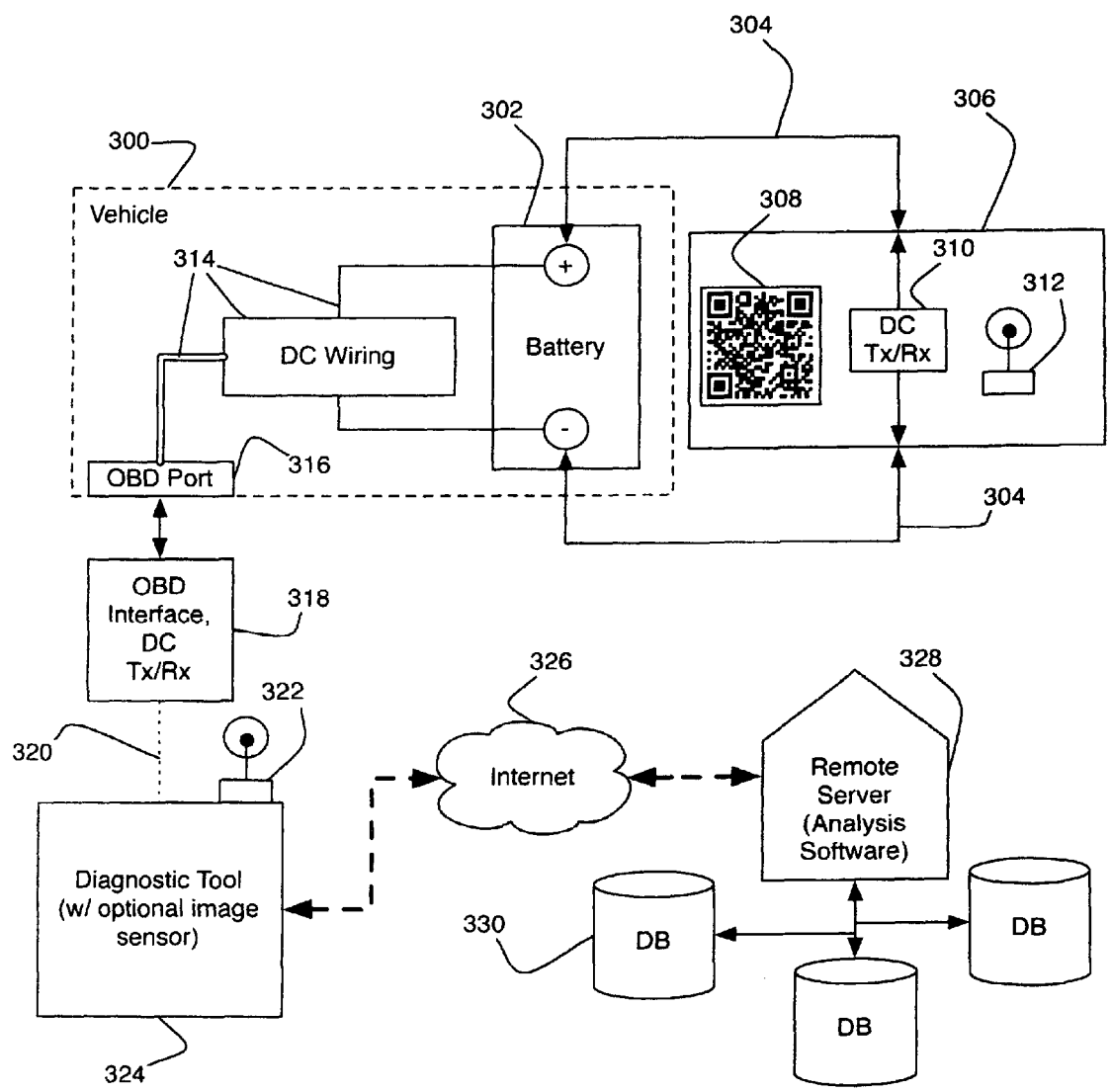
FIG. 10 shows a schematic diagram of a system wherein the DC bus wiring of a vehicle is employed as a communication link.

The arrangement of the components needed to employ the Shop Diagnostic Platform to carry out the above-described alternative is schematically shown in FIG. 10. The simplified battery test device 306 is connected to a battery 302 that is installed in a vehicle 300. The battery test device 306 is connected to the battery 302 with a wired connection 304 that is typical of electronic battery testers, such as a pair of Kelvin connections. In the embodiment depicted in FIG. 10, the battery tester 306 can implement one or more methods of outputting battery test data and other data that is obtained by the simplified battery test device 306. So as to be useful in other applications (such as those described above) the tester 306 may include an optical output device such as a screen for displaying a QR code 308, a radio communication link 312 for enabling Bluetooth, WiFi, or other radio frequency methods, or, as used in this alternative, a DC powerline communication facility 310. The DC powerline communication facility 310 uses a hard-wired connection 304 to send battery test data and other data along the DC wiring 314 of the vehicle 300. In this way, a receiver 318 connected to the DC wiring of the vehicle can receive the battery test data. In the example shown in FIG. 10, this receiver could be an OBD Interface 318 of a Shop Diagnostic Platform 324. The OBD interface 318 connects to the vehicle DC wiring 314 at the OBD port 316. Thus, the Shop Diagnostic Platform 324 could receive the battery test data via the OBD port 316, via a wired connection 320, optical image sensor, or otherwise.

While in this embodiment the OBD port 316 is used to access the vehicle DC wiring, the transmission of information does not involve the vehicle computer or the OBD system. Rather the vehicle OBD port 316 includes a pin that is connected via the vehicle wiring harness to the positive terminal of the battery, and another pin that is connected to vehicle ground, which is tied to the negative terminal of the battery. A digital message including the test results and related data is simply transmitted, effectively superimposed on the (nominally) 12 volts across the battery terminals. In this way, the DC communication of test data can be achieved without any involvement of the vehicle computer system. While it is convenient to use the vehicle OBD port 316 to connect to the vehicle DC wiring, a DC communication receiver 318 could be connected anywhere on the vehicle DC wiring harness 314.

Alternatively, if suitably equipped, the Shop Diagnostic Platform 324 could receive the battery test data by using an image sensor and capturing an image from the display screen 308 of the simplified battery tester 306, as described above, or could receive the battery test data via a radio receiver 322 by communicating directly with the radio transmitter 312.

The Shop Diagnostic Platform 324 may then perform essentially as the smart devices described previously, that is, may comprise a user interface and run battery diagnostic software directly. Alternatively the Shop Diagnostic Platform 324 may be capable of connection to the Internet at 326 and can send battery test data and other vehicle data received from the OBD interface 318 to a remote server 328 as described above, in either the web client or web server embodiments of the method of the invention.

In this embodiment, the simplified battery test device can provide battery test data to a diagnostic tool that is already used in a workshop environment, thus reducing the number of tools that a technician must employ. By employing the internet for communication with a web server running the analysis software, the diagnostic tool can also be simplified.

FIG. 11 illustrates the steps carried out in use of a Shop Diagnostic Platform 324 (referred to as "Diagnostic Tool" in FIG. 11) to perform the method of the invention. As previously, the simplified battery tester 306 is connected to the battery at 350, carries out the test routine at 352, generates the raw data and optionally a web server address, and outputs this information at 356. The Shop Diagnostic Platform 324 having been connected to the vehicle's OBD port, the test is initiated on the Shop Diagnostic Platform 324 at 358. The Shop Diagnostic Platform 324 then receives the battery test data at 360, and accesses the available context information such as the VIN from vehicle computer via the OBD port at 362. The Shop Diagnostic Platform 324 then carries out the steps necessary to analyze the data to characterize the battery, at 364. This can be done in any of three ways, each substantially as described above. The Shop Diagnostic Platform 324 can carry out the analysis itself, at 368; this corresponds to the initial embodiment of the invention described above, where the smart device does not contact a web server at all. Alternatively, the Shop Diagnostic Platform 324 can carry out the "web client" approach at 366, in which the Shop Diagnostic Platform 324 includes software prompting the user to take the various input steps, as in connection with FIG. 7; or it can carry out the "web browser" approach of FIGS. 8 and 9 at 370, where the web server essentially directs the collection of data as needed. In both "web client" and "web browser" approaches, the web server performs the battery analysis, as above. In each case the results of the test are communicated to the user at 372.

Thus, a device marketed as a Shop Diagnostic Platform or the like, as opposed to a smart phone or tablet computer not dedicated to shop tasks, can nonetheless be considered a "smart device" within the appended claims where it has the requisite capabilities.

Although the invention has been described in the context of testing vehicle batteries, it has uses elsewhere in the battery testing industry. For example, it is commonplace to employ large banks of "stationary" batteries for such purposes as providing back-up emergency power supplies for such uses as traffic control signals, hospitals, telecommunications and other critical facilities. Such banks of batteries are normally kept fully-charged, so that the question of testing possibly discharged batteries does not arise. However, such batteries do lose storage capability as they age, and it is important accordingly to monitor their decline. This is normally done by making ohmic measurements, as above.

According to the invention, the complex and expensive battery testers now used for this purpose, which typically comprise test circuitry for making such ohmic measurements together with a user interface for allowing the user to enter a battery identification number or the like, memory for storing the results associated with each battery, communication facilities for transmitting reports to a central computer tracking the results, and so on, can be replaced by the simplified battery testing device and smart device according to the invention.

In such a use, the simplified battery testing device 12 would be connected in succession to each battery to be tested, and perform the basic ohmic measurement discussed above, that is, measure the internal resistance of the battery. This would then be transmitted to the smart device 14 as above, and the smart device 14 would likewise be employed as above to analyze the raw data to evaluate the battery with reference to a standard for batteries of that type, and record the result along with an identification of the battery. The results for a large number of batteries tested could then be downloaded to a central computer, printed out, or the like.

Alternatively or additionally, results from a battery test on one day can be compared with prior test results for the same battery to determine trends. The battery test results may be stored in the smart device or stored in a remote database that is dynamically accessible by the smart device. In this way the operator may identify a battery that has been previously tested using any of the battery identity details discussed above. Once the battery has been identified, the current test results are automatically compared to the previous results to provide battery decay rate information.

Finally, as noted above, while the tester of the invention has been described in detail in the battery testing context, it is not limited thereto but has applicability to testing of numerous different types of equipment, apparatus, or components. As mentioned above, in each case a simplified testing device would be provided with appropriate components to connect the microprocessor control unit (MCU) of a testing device to the circuitry of the equipment, apparatus, or component to be tested, and the MCU would be programmed with appropriate software, for example, to perform a physical measurement of a value (as in the battery testing embodiment), to interrogate an internal memory (as in the OBD example), obtain identification of the item being tested (by way of an RFID chip, as above) or otherwise. The simplified testing device would then transmit this information to an associated smart device for analysis and appropriate action.

In addition to the battery testing and OBD download capabilities of testers according to the invention already discussed, there are numerous applications for testers according to the invention, both within and without the automotive industry. For example, telecommunications facilities are commonly tested using testers that measure such parameters as data rate, to verify that the subscriber is receiving the promised service. Such testers are now commonly integrated, as above; that is, they comprise both circuitry for applying a test signal to the facility and measuring its response, and a microprocessor with appropriate software for analyzing the results, receiving user input via a user interface, and reporting the results. As above, according to the invention such an integrated tester can be replaced with a simplified test device for performing the basic test operation, and for communicating the raw data resulting therefrom to an appropriately-programmed smart device, for analysis, user input, reporting of results, and the like.

Accordingly, the principal function of the simplified tester of the invention can be described generically as obtaining data indicative of the condition of the equipment, apparatus or component to be tested—again, including in this terminology such things as measuring a value (as in the battery case), downloading stored data (e.g., downloading data representative of the condition of a vehicle from its OBD port), or injecting a signal into a circuit and measuring its response (as in the case of telecommunication testing)—and transferring the data thus obtained to the smart device. As discussed, the smart device, having been provided by appropriate software (typically by download of a software "app" offered by the proprietor of the particular testing device) then determines the condition of the equipment, apparatus or component responsive to the obtained data. As above, the data analysis function can be alternatively be performed by a web server responsive to data communicated thereto by the smart device.

Therefore, while several preferred embodiments of the invention have been described in detail, numerous improvements and enhancements are within the skill of the art, and are accordingly within the scope of the invention where not excluded by the following claims.

What is claimed is:

1. A testing device for use in a system for testing equipment, an apparatus, or a component, providing distributed measurement and analytical functions, said system comprising:

A) said testing device being specifically designed to be connected to particular examples from a specified class of equipment, apparatus, or component to be tested, to perform a test of a particular example of said equipment, apparatus, or component so as to obtain data indicative of the condition of said particular example of equipment, apparatus, or component, and to communicate values pertaining to said particular example of said equipment, apparatus, or component representative of said data to a smart device;

B) a smart device independent from the testing device, capable of other uses, and adapted by software stored therein corresponding to said testing device to 1) receive said values pertaining to said particular example of said equipment, apparatus, or component communicated by said testing device; 2) obtain an identification of the particular example of equipment, apparatus, or component being tested; and 3) communicate the received values pertaining to said particular example of said equipment, apparatus, or component and said identification of the particular example of equipment, apparatus, or component being tested to a remote computer device; and C) a remote computer device adapted to receive said values pertaining to said particular example of said equipment, apparatus, or component and said identification of the particular example of equipment, apparatus, or component being tested communicated by the smart device, to employ said identification to access a database containing data indicative of the nominal characteristics of the particular example of equipment, apparatus, or component being tested, to analyze said values pertaining to said particular example of said equipment, apparatus, or component with respect to the nominal characteristics to determine the condition of the particular example of equipment, apparatus, or component being tested, and provide an indication of the condition of said particular example of equipment, apparatus, or component being tested.

2. A testing device for use in the system of claim 1, wherein said values representative of said data obtained by said testing device pertaining to said particular example of said equipment, apparatus, or component are transferred from said testing device to said smart device by displaying an optical code readable by said smart device on a screen comprised by said testing device, and wherein said smart device is further adapted by software to read said optical code using an image sensor device comprised thereby and derive said values representative of said data obtained by said tester therefrom.

3. A testing device for use in the system of claim 2, wherein said optical code is a bar code.

4. A testing device for use in the system of claim 2, wherein said optical code is a two-dimensional code.

5. A testing device for use in the system of claim 4, wherein said two-dimensional code is a QR code.

6. A testing device for use in the system of claim 2, wherein said smart device is further adapted by software to employ an image sensor device comprised thereby to read an identification of said equipment, apparatus, or components to be tested.

7. A testing device for use in the system of claim 1, wherein said smart device capable of other uses is a smart phone.

8. A testing device for use in the system of claim 1, wherein said smart device capable of other uses is a tablet computer.

9. A testing device for use in the system of claim 1, wherein said equipment, apparatus, or component is a battery.

10. A testing device for use in the system of claim 9, wherein said battery is installed in a vehicle, and said values representative of said data obtained by said testing device are transferred from said testing device to said smart device over preexisting wiring of said vehicle.

11. A testing device for use in the system of claim 10, wherein said preexisting wiring of said vehicle includes an onboard diagnosis port to which said smart device can be connected.

12. A testing device for use in the system of claim 10, wherein the smart device is a Shop Diagnosis Platform capable of analyzing other vehicle functions.

13. A testing device for use in the system of claim 10, wherein said smart device is further adapted by software to employ an image sensor device comprised thereby to read an identification of a vehicle with which said battery is associated.

14. A testing device for use in the system of claim 1, wherein said smart device receives an indication of the identification of the particular example of said equipment, apparatus, or component by user input.

15. A testing device for use in the system of claim 1, wherein said smart device receives an indication of the identification of the particular example of said equipment, apparatus, or component by employing an image sensor device comprised by the smart device to read the identification of said equipment, apparatus, or component directly therefrom.

16. A testing device for use in the system of claim 1, wherein said equipment, apparatus, or component to be tested is a battery, and said data indicative of battery condition obtained by said testing device includes at least an open-circuit voltage and an ohmic value.

17. A testing device for use in the system of claim 16, wherein said battery is installed in a vehicle, and said testing device measures further parameters during an engine starting sequence, during which said battery provides power to a starter motor to start an engine.

18. A testing device for use in the system of claim 17, wherein said further parameters include at least the minimum battery voltage experienced during said starting sequence.

19. A testing device for use in the system of claim 17, wherein said testing device first communicates values representative of said open-circuit voltage and an ohmic value to said smart device and subsequently communicates values representative of said further parameters to said smart device.

20. A testing device for use in the system of claim 19, wherein said testing device communicates said values representative of said open-circuit voltage and an ohmic value and said values representative of said further parameters by successive display of one or more machine-readable codes readable by said smart device.

21. A testing device for use in the system of claim 1, wherein said smart device comprises software causing said smart device to prompt a user to input pertinent information.

22. A testing device for use in the system of claim 1, wherein said smart device functions as a web browser and the remote computer device as a web server.

23. A testing device for use in the system of claim 22, wherein the testing device communicates a Web address indicative of the address of the remote computer to the smart device together with the values representative of said data indicative of the condition of said equipment, apparatus, or component.

24. A testing device for use in the system of claim wherein said testing device comprises a radio-frequency identification (RFID) receiver adapted to read an identification of the equipment, apparatus or component from an RFID chip comprised thereby.

25. A testing device for use in the system of claim 1, wherein said particular example of equipment, apparatus, or component to be tested is a battery installed in a vehicle, and said remote computer device is further adapted to receive identification data in respect of said battery and said vehicle, is connected to a database storing nominal values for data representative of the nominal characteristics of the battery to be tested and of the vehicle, and is further adapted to compare the determined condition of the battery to be tested as corrected for the characteristics of the vehicle to the data indicative of the nominal characteristics of the particular example of equipment, apparatus, or component to be tested.

26. A testing device for use in the system of claim 25, wherein the characteristics of the vehicle for which the received values are corrected are ohmic values for conductors connecting the battery to a remote test point.

27. The testing device of claim 26, wherein the remote test point is an onboard diagnostic port.

28. The testing device of claim 26, wherein the remote test point is a remote connection post as provided for jump-starting of the vehicle.

29. A method of determining the condition of a piece of equipment, an apparatus, or a component, comprising the steps of:
1) connecting a simplified testing device specifically designed to test a specified class of equipment, apparatus, or component to a particular example of equipment, an apparatus, or a component of said specified class;
2) employing said simplified testing device to perform a test so as to obtain data indicative of the condition of the particular example of equipment, apparatus or component;
3) communicating said data from said testing device to a smart device capable of other uses,
4) employing said smart device to obtain an identification of the particular example of equipment, apparatus, or component;
5) communicating said data and said identification from said smart device to a remote computer; and
6) employing said remote computer, using said identification of the particular example of equipment, apparatus, or component, to obtain information concerning the nominal characteristics of said particular example of equipment, apparatus, or component and to evaluate the determined condition of the particular example of said equipment, apparatus, or component by analysis of said data and comparison to said information concerning the nominal characteristics of said particular example of equipment, apparatus, or component.

30. The method of claim 29, wherein said step of communicating said data from said testing device to a smart device is performed by displaying a machine-readable optical code readable by a smart device on a display screen comprised by said testing device, said code including said data obtained indicative of the condition of said equipment, apparatus, or component, and employing a smart device to read said code from said display screen.

31. The method of claim 30, wherein said machine-readable optical code displayed on the display screen comprised by said testing device and read therefrom by said smart device is a bit-mapped code.

32. The method of claim 31, wherein said bit-mapped code displayed on the display screen comprised by said testing device and read therefrom by said smart device is a QR code.

33. The method of claim 30, wherein said machine-readable optical code displayed on the display screen comprised by said testing device and read therefrom by said smart device is a bar code.

34. The method of claim 29, wherein said smart device capable of other uses is a smart phone.

35. The method of claim 29, wherein said smart device capable of other uses is a tablet computer.

36. The method of claim 29, wherein said smart device is further adapted by software to employ an image sensor device comprised thereby to read an identification of said equipment, apparatus, or component to be tested.

37. The method of claim 36, wherein said equipment, apparatus, or component is a battery.

38. The method of claim 37, wherein said identification of said equipment, apparatus, or component is an identifying characteristic of a vehicle with which said battery is associated.

39. The method of claim 38, wherein said remote computer is associated with a database containing nominal data in respect of characteristics of batteries to be tested and of vehicles, and wherein said nominal data is employed by said remote computer in evaluation of the determined condition of the battery from said data indicative of the condition of the battery.

40. The method of claim 29, wherein said equipment, apparatus, or component to be tested is a battery, and said data indicative of said determined condition of said battery obtained by said testing device include at least an open-circuit voltage and an ohmic value.

41. The method of claim 40, wherein said battery is installed in a vehicle, and said testing device measures further parameters of said battery during an engine starting sequence, during which said battery provides power to a starter motor to start an engine.

42. The method of claim 41, wherein said further parameters include at least the minimum battery voltage experienced during said starting sequence.

43. The method of claim 42, wherein said testing device first communicates values representative of said open-circuit voltage and an ohmic value to said smart device and subsequently communicates values representative of said further parameters to said smart device.

44. The method of claim 43, wherein said testing device communicates said values representative of said open-circuit voltage and an ohmic value and said values representative of said further parameters by successive display of more than one machine-readable optical codes readable by said smart device.

45. The method of claim 29, wherein said smart device comprises software causing said smart device to prompt a user to input pertinent information.

46. The method of claim 29, wherein said smart device functions as a web browser and the remote computer device as a web server.

47. The method of claim 29, wherein the testing device communicates a web address indicative of the address of the remote computer to the smart device together with the data indicative of the condition of said equipment, apparatus, or component.

48. The method of claim 29, wherein said testing device is further enabled to receive an identification of the equipment, apparatus or component to be tested therefrom, and to transmit said identification to the smart device together with the data indicative of the condition of said equipment, apparatus, or component.

49. The method of claim 48, wherein said testing device comprises a radio-frequency identification (RFID) receiver adapted to read an identification of the equipment, apparatus or component from an RFID chip comprised thereby.

50. The method of claim 39, wherein said database containing nominal data in respect of characteristics of batteries to be tested and of vehicles includes data indicative of the ohmic value of conductors connecting the battery to a remote test point.

51. The method of claim 50, wherein the remote test point is an onboard diagnostic port.

52. The method of claim 50, wherein the remote test point is a remote connection post as provided for jump-starting of the vehicle.

* * * * *